United States Patent [19]

Watanabe et al.

[11] Patent Number: 5,319,603
[45] Date of Patent: Jun. 7, 1994

[54] MULTIPORT SEMICONDUCTOR MEMORY DEVICE HAVING RAM BLOCKS AND SAM BLOCKS

[75] Inventors: Nobuo Watanabe, Yokohama; Koichi Magome, Hiratsuka; Katsumi Abe; Haruki Toda, both of Yokohama, all of Japan

[73] Assignee: Kabushiki Kaisha Toshiba, Kawasaki, Japan

[21] Appl. No.: 778,154

[22] PCT Filed: Apr. 30, 1991

[86] PCT No.: PCT/JP91/00587
§ 371 Date: Dec. 24, 1991
§ 102(e) Date: Dec. 24, 1991

[87] PCT Pub. No.: WO91/17544
PCT Pub. Date: Nov. 14, 1991

[30] Foreign Application Priority Data

Apr. 27, 1990 [JP] Japan .................................. 2-112722

[51] Int. Cl.$^5$ .............................................. G11C 8/00
[52] U.S. Cl. .......................... 365/230.05; 365/230.04; 365/230.09
[58] Field of Search ....................... 365/230.05, 230.09, 365/230.04

[56] References Cited

U.S. PATENT DOCUMENTS 5,065,368 11/1991 Gupta et al. .................... 365/230.05
5,121,360 6/1992 West et al. ...................... 365/230.09

FOREIGN PATENT DOCUMENTS 0479163A 4/1992 European Pat. Off. .

Primary Examiner—Eugene R. LaRoche
Assistant Examiner—Viet Q. Nguyen
Attorney, Agent, or Firm—Foley & Lardner

[57] ABSTRACT

A multiport semiconductor memory device of this invention is constructed as having: a RAM having a first RAM unit and a second RAM unit; a SAM having a first SAM unit and a second SAM unit; and transfer circuit capable of selectively taking one of a split transfer state and a cross transfer state, in the split transfer state the first RAM unit and the first SAM unit being connected together and the second RAM unit and the second SAM unit being connected together, and in the cross transfer state the first RAM unit and the second SAM unit being connected together and the second RAM unit and the first SAM unit being connected together.

37 Claims, 18 Drawing Sheets

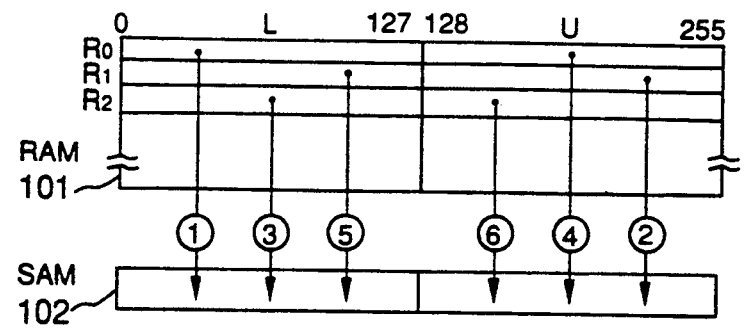
F I G. 5A
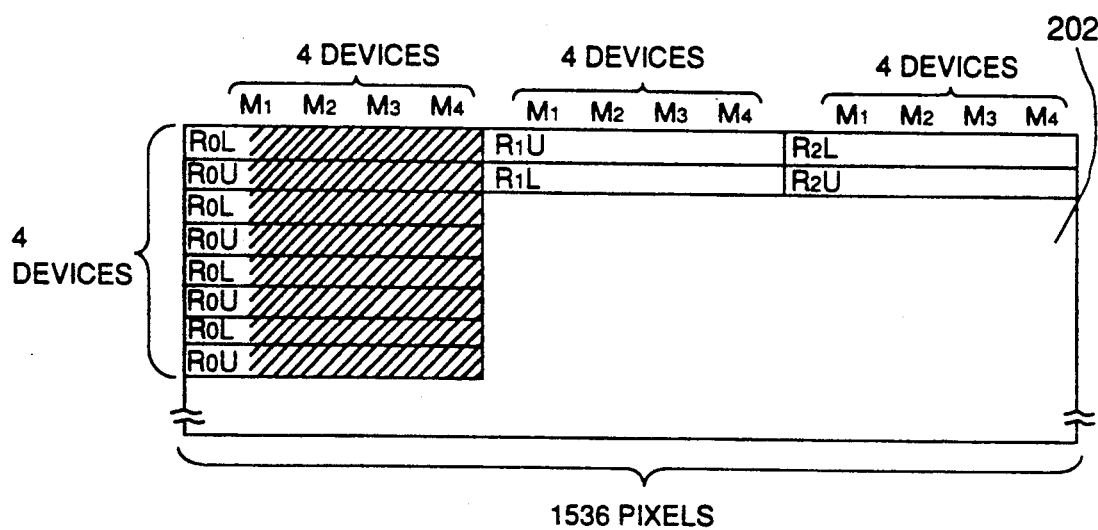
F I G. 5B

MAPPING ON CRT DISPLAY
| 1 | 2 |
|---|---|
| 3 | 4 |
| 5 | 6 |
| 7 | 8 |
| 9 | 10 |
| ⋮ | ⋮ |
F I G. 8
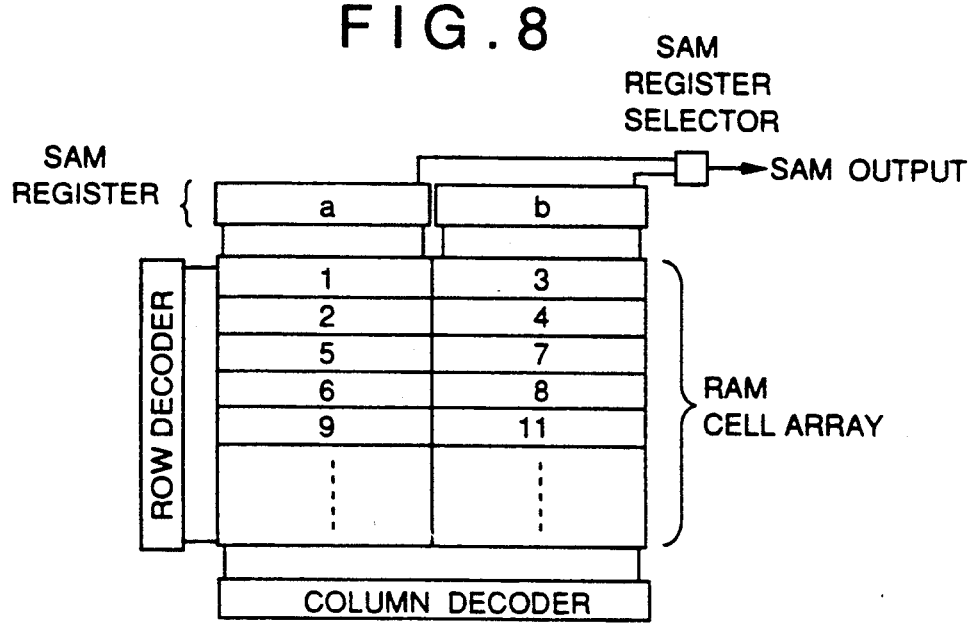
F I G. 9
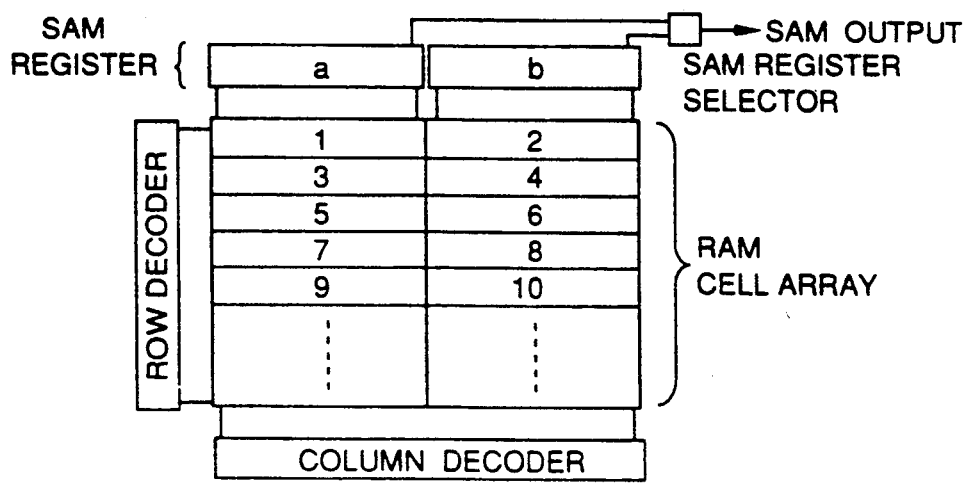
F I G. 10

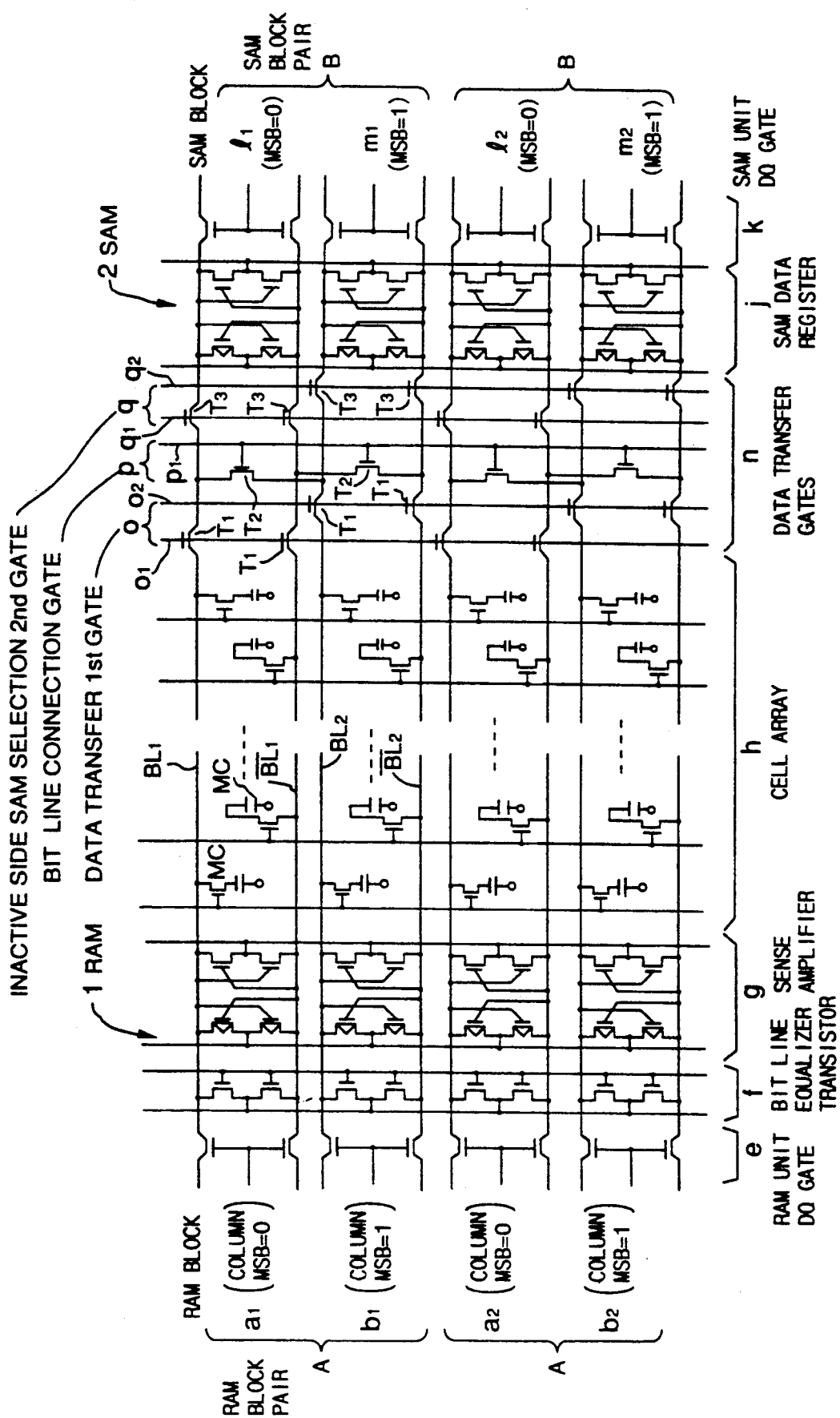
F I G. 12

MAPPING ON CRT DISPLAY
| 1 | 2 | 3 | 4 |
|---|---|---|---|
| 5 | 6 | 7 | 8 |
| 9 | 10 | 11 | 12 |
| 13 | 14 | 15 | 16 |
| 17 | 18 | 19 | 20 |
| 21 | 22 | 23 | 24 |
| 25 | 26 | 27 | 28 |
| 29 | 30 | 31 | 32 |
| ⋮ | ⋮ | ⋮ | ⋮ |
FIG. 15
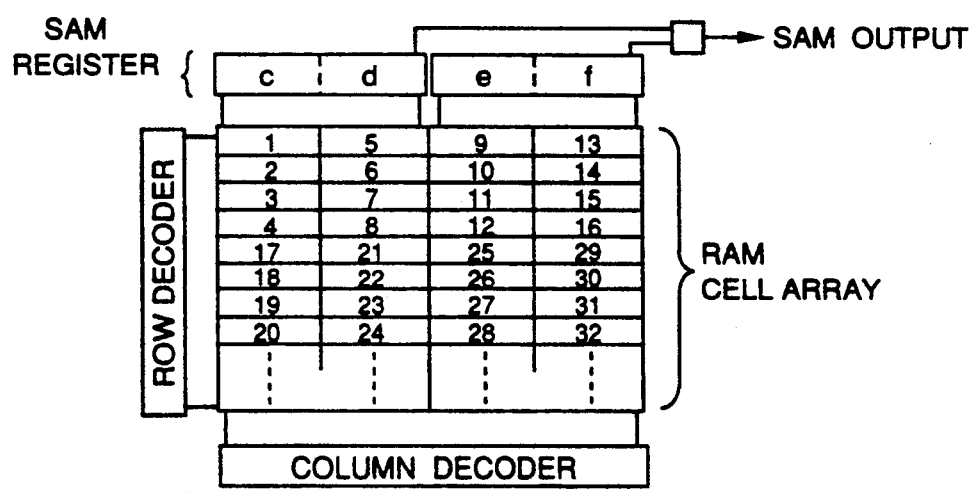
FIG. 16
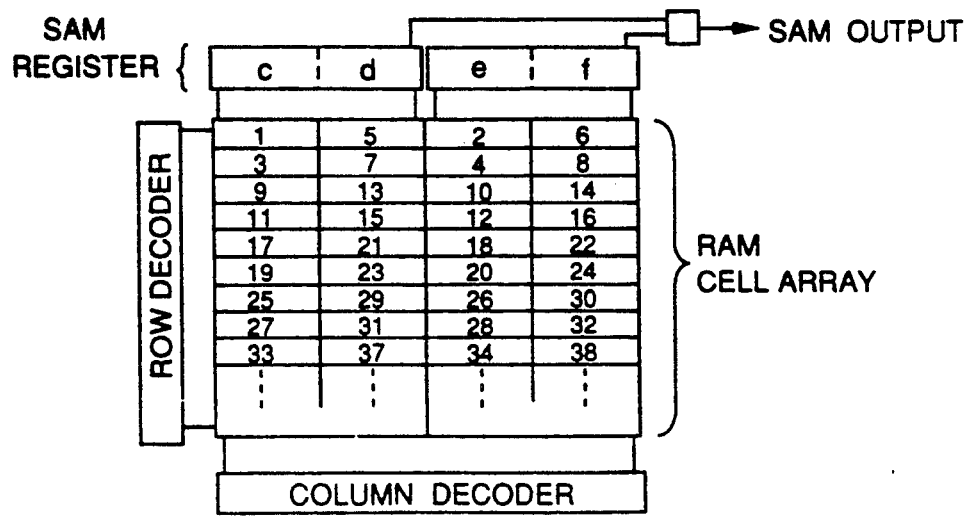
FIG. 17

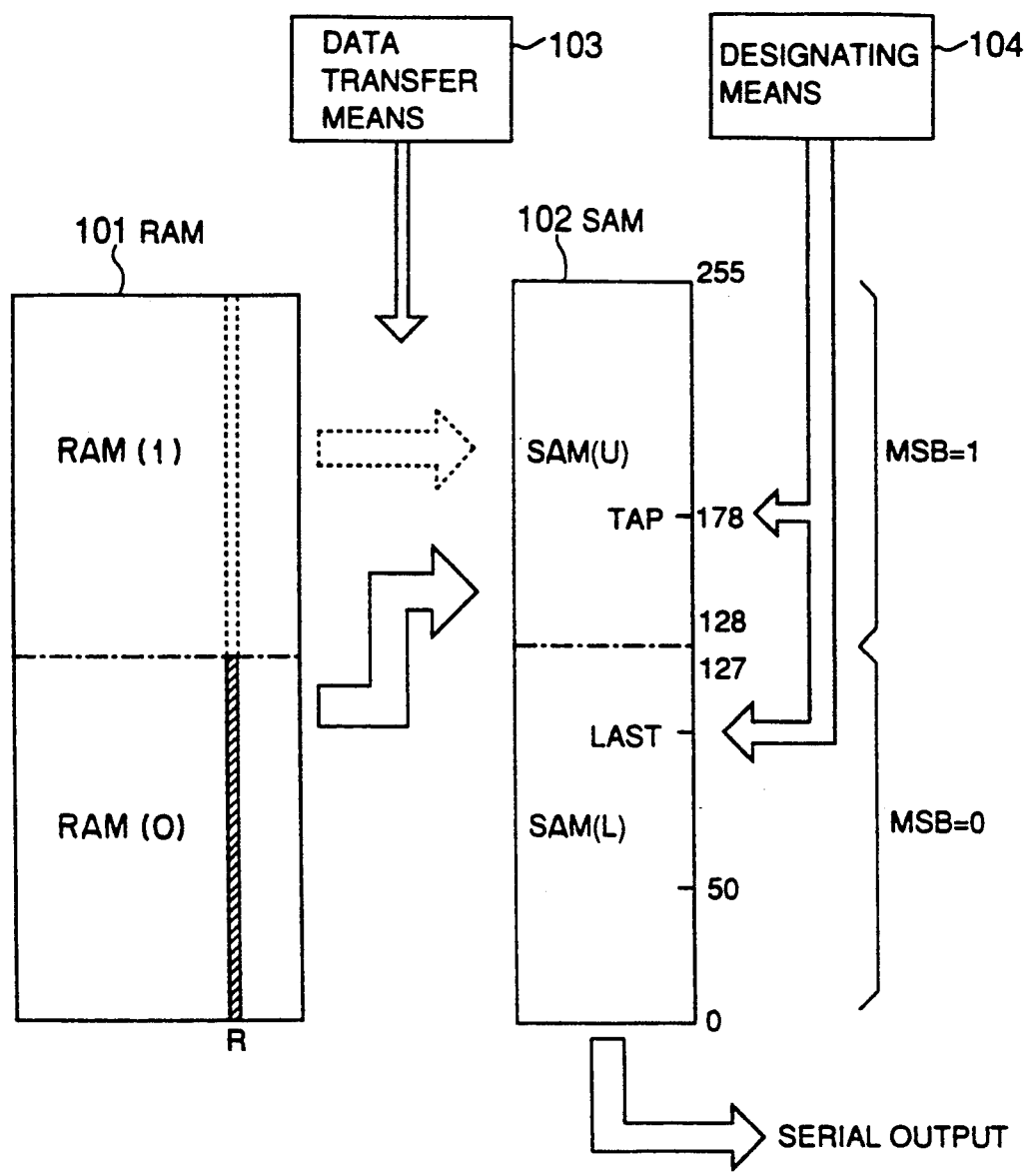
F I G . 18

MULTIPORT SEMICONDUCTOR MEMORY DEVICE HAVING RAM BLOCKS AND SAM BLOCKS

FIELD OF THE INVENTION

The present invention relates to a semiconductor memory device, and more particularly to a semiconductor memory device used for graphics which device is generally called a multiport video DRAM having a RAM and a SAM functioning as a serial register for the RAM.

The present invention relates also to the field of a computer graphics system, particularly to a device suitable for use as a frame buffer for storing image data and outputting the image data to a CRT.

BACKGROUND OF THE INVENTION

Recently, a multiport video RAM (MPRAM) has drawn attention as a memory suitable for high speed data processing and displaying in the fields of engineering work stations (EWS), computer graphics (CG), and the like. This MPRAM has a random access port (RAM port) having a memory array (e.g., DRAM) randomly accessible and a serial access port (SAM port) having a serial access memory cyclically and serially accessible.

In an MPRAM, data is transferred between the RAM port and SAM port. It is necessary to synchronize data transfer timings only during the transfer cycle. The timings during the transfer cycle will be described with reference to FIGS. 1A and 1B.

Referring to FIG. 1A, there will be described the case wherein data at a certain row R in a memory array 101 of a RAM port is transferred to a serial access memory 102 having a SAM port which continuously executes serial access. In this case, an external signal $\overline{DT}$ for controlling transfer is first caused to fall (at time T1 in FIG. 1B). If the external signal DT takes an "L" level at the time when a signal $\overline{RAS}$ falls, then the transfer cycle starts. During this transfer cycle, similar to an ordinary RAM cycle, a row address and column address are supplied synchronously with the trailing edges of $\overline{RAS}$ and $\overline{CAS}$ (at times T2 and T3). The row address indicates a row of transfer data in the memory array 101, and different from an ordinary RAM cycle, the column address indicates a TAP address representative of the position of a new serial cycle after the data transfer. The transferred data is outputted starting from the TAP address at the serial cycle (time T6) after the external signal $\overline{DT}$ rises.

It is necessary for the external signal $\overline{DT}$ to rise at the timing (time T5) between the rising timing (time T4) and next rising timing (T6) of a serial clock signal SC. Therefore, time periods t1 (=T5−T4) and t2 (T6−T5) have some restriction. Such restriction of the time periods t1 and t2 is very severe for the application to practical products because the cycle time of the serial clock signal SC is 30 to 40 nsec.

In order to mitigate such restriction, a split transfer system has been proposed.

This split transfer system will be described with reference to FIGS. 2A and 2B. A serial access memory 102 having a SAM port to which the split transfer system is applied is divided into two groups of SAM (L) and SAM (U). The divided SAM (L) and SAM (U) correspond to "0" and "1" of the most significant bit (MSB) of the TAP address. It is therefore possible to transfer data from RAM 101 to SAM (L) and SAM (U) independently from each other. It is assumed that SAM (L) is now serially accessed. Consider the case wherein during this serial access a transfer cycle occurs, and the data at a row R of a memory array 101 having a RAM port is transferred to SAM 102. Similar to the case of FIG. 1A, the row address at this time indicates the row R. MSB of the TAP address is set to MSB (in this case "1") on the SAM side which is not now serially accessed. SAM for which transfer operation is carried out is SAM (U) with MSB set. The data transferred to SAM (U) is accessed starting from the TAP address with newly set MSB, when the serial access further continues and changes from SAM (L) to SAM (U). In the case shown in FIG. 2B, during the transfer cycle for the serial address 0 to 127, data in RAM 101 at the row R is transferred to SAM (U) at addresses 128 to 255. As the serial access advances to an address 127 and enters the next SC cycle, the TAP address is accessed to further continue the serial access. As described above, since the divided serial memory unit serially accessed and the divided serial access memory to which data is being transferred are different, there is no timing restriction as described with FIG. 1B.

Such split transfer will be described with reference to a more particular circuit diagram.

FIG. 3 is a schematic diagram illustrating a split data transfer state and a correspondence between RAM 1, SAM 2, and transfer gates interconnecting RAM 1 and SAM 2. FIG. 4 is a circuit diagram showing the details of a portion of FIG. 3.

Referring to FIG. 3, for the split data transfer, RAM 1 is divided into a first lower RAM unit 1 corresponding to MSB=0 of the column address, and a second upper RAM unit b corresponding to MSB=1. As seen from FIG. 4 which will be later described in detail, each column of RAM 1 is in one-to-one correspondence with each column of SAM 2. Accordingly, during the split data transfer, data in a memory cell MC belonging to the lower (MSB=0) first RAM unit a is transferred to a register j of a lower first SAM unit c, whereas data in a memory cell MC belonging to the upper (MSB=1) second RAM unit b is transferred to a register j of an upper second SAM unit d.

FIG. 4 shows the details of the first RAM unit a and first SAM unit c, respectively for MSB=0. In FIG. 4, the circuit portion for four columns is shown. Each column has a pair of bit lines BL and $\overline{BL}$. The RAM unit a has a cell array h constituted by a plurality of memory cells MC connected to the bit lines BL and $\overline{BL}$, bit line equalizing transistors f for equalizing pairs of the bit lines BL and $\overline{BL}$, and RAM unit DQ gates e for data transfer to and from an external circuit.

The SAM unit c is connected via the data transfer gates i to the RAM unit a. The SAM unit c functions as a serial register for the RAM unit a, and has SAM data registers j and SAM unit SDQ gates k.

The RAM unit b and SAM unit d are constructed in the similar manner described above.

If continuous read/write, for example, is to be executed by the split data transfer using the device shown in FIGS. 3 and 4, the two upper and lower RAM units a and b are alternately accessed depending upon whether MSB of the column address is "0" or "1". Therefore, continuous access within the same RAM unit cannot be allowed. Namely, different memory cells within the lower (MSB=0) first RAM unit a cannot be accessed continuously, neither different memory cells within the upper (MSB=1) second RAM unit b can be accessed continuously. A memory which cannot execute such an access is not proper in displaying an image at high speed on a CRT or the like. This is an issue newly recognized solely by the present inventors. The above discussion will be further described in detail from a different viewpoint.

Next, there will be described a method of configuring a data buffer for processing displayed data on a screen at high speed using the split transfer method.

A DRAM is used as a random access memory for MPRAM. If data at the same row is accessed using the page mode for DRAM, data can be accessed in a time period ¼ to ⅛ time as short as the time period required when data is accessed by changing the row address. The data at one row corresponds to the data to be serially outputted from the SAM unit. This serial data becomes a pixel data on a display screen. How pixel data is disposed on a screen is important for high speed screen processing. In the screen processing, if pixels within a square area can be processed at high speed, any type of pattern processing can be executed at high speed. Namely, screen processing can be executed at high speed in any direction including a vertical direction, horizontal direction, and oblique direction. It becomes therefore important how the data at one row accessible by the page mode is allocated in the vertical direction relative to the scan direction of the display screen.

Consider now the case where a screen is constituted by using sixteen DPRAM's, four in the scan direction and four in the vertical direction, i.e., a 4×4 tile structure is adopted. FIGS. 5A and 5B show DPRAM's of the split transfer type wherein data at one row of a random access memory (RAM) has 256 bits, and data of a serial access memory (SAM) also has 256 bits. The screen size is assumed to have 1536 pixels in the scan direction, for the simplicity of description. Referring to FIG. 5A, R0, R1, R2, . . . represent a row of RAM 101, and 0 to 127 (L) and 128 to 255 (U) in the column direction represent a column of RAM 101 from which data is split-transferred to SAM 102 divided into two blocks.

The length in the scan direction of a single tile is 128×4=512 bits because four devices M1, M2, M3, and M4 are used and each divided partial SAM has 128 bits. The length in the vertical direction is 2×4 devices=8 bits. Therefore, three (1536/512=3) tiles are disposed in the scan direction of the screen. If the partial SAM (L) and partial SAM (U) are assigned to pixels in the vertical direction, screen processing for a shape more like a square can be executed through an access of one row by the page mode. Data in the RAM unit is split-transferred in the order of R0L, R1U, R2L, R0U, R1L, R2U, . . . The SAM unit 102 serially outputs the data to scan pixels. Of the data on the screen, an area indicated by hatched lines in FIG. 5B is made of the R0 data in the four devices. Any desired portion of the area R0, for example, of the four devices can be accessed by the page mode. The screen is filled with tiles as indicated by hatched lines in FIG. 5B, and the tile can be accessed by the page mode. In other words, high speed screen processing becomes possible.

The data structure in the scan direction will be further described in detail. FIG. 6 illustrates in what way pixels are constituted using serial data from four MPRAM's. The four bit output data from SAM's of the devices M1 to M4 is applied to a parallel/serial converter circuit (refer to FIG. 6(a)), and outputted therefrom as one bit serial data so that pixels of the screen are formed one point after another. With such an arrangement, SAM can be serially accessed at the speed ¼ time as slow as the screen display speed, thereby reducing the load on SAM. The pixel data subjected to such parallel/serial conversion becomes a repetition of data from DPRAM's of M1, M2, M3, and M4 in this order in the scan direction (refer to FIG. 6(b)). The data in each frame of R0L and R0U within the tile shown in FIG. 5B has such a data structure.

The case where the screen size is different from the above-described size will then be described.

FIGS. 7A and 7B illustrate the case where the number of pixels in the scan direction is 1024. The tile size is assumed to be constituted by using 4×4 MPRAM's similar to the above-described case. In this case, two (1024/512=2) tiles are disposed in the scan direction of the screen. In order to make divided data U and L at one row correspond to the pixel disposal in the vertical direction of the screen, it is necessary to split-transfer the data in the order shown in FIG. 7A. Specifically, if the data is transferred in the order of R0L, R1U, R0U, R1L, . . . , then the area indicated by hatched lines in FIG. 7B can be freely accessed by the RAM page mode. In this data transfer, however, L and U are crossed relative to SAM so that a conventional split transfer cannot deal with it. If a split cross transfer is adopted which can transfer data from U of SAM to L of SAM, or from L of RAM to U of SAM, then the data transfer shown in FIG. 7A becomes possible while allowing to deal with the case wherein an even number of tiles are disposed in the scan direction of the screen. This is an issue newly recognized solely by the present inventors.

As discussed previously, it is more suitable for high speed screen processing if data in RAM in the column direction accessible at high speed is made to correspond to a pixel area on the screen having a shape more like a square. However, so long as SAM is used as two divided units as in the above-described cases, the length of a tile in the scan direction becomes longer than that in the vertical direction, which is a disadvantage in high speed screen processing. Such disadvantage can be dealt with by changing the size of a tile. However, a change of a tile size results in that a buffer memory system design is required to be changed depending on the size of a screen.

Such a problem will be described further from a different viewpoint.

In a graphics system frame buffer using multiport video RAM's having a split transfer function, the SAM port is used for outputting and displaying data on a CRT, and the RAM port is used for inputting/outputting image data relative to a graphics processor. This buffer operates to store image data and output data to a CRT at high speed. For outputting data to a CRT, it is necessary to output the data continuously and at high speed. To this end, as described above, a split transfer function is provided so that data output from SAM and data transferred from RAM to SAM are alternately interleaved while dividing the SAM register and RAM cell array into two blocks, respectively.

A frame buffer using multiport video RAM's of a conventional split transfer type will be described. Each dot on a CRT screen in the vertical direction is made in correspondence with each cell data aligned in row direction. In such a case, if a CRT is mapped as shown in FIG. 8, then the corresponding cells in multiport video RAM's are disposed as shown in FIG. 10. The scan lines on the CRT are traced in the order of 1, 2, 3, 4, ... shown in FIG. 8. Therefore, SAM's of the multiport DRAM's correspondingly output the data in the RAM cell array in the order of 1, 2, 3, 4, ... In this case, it is necessary that SAM's output data be continuous data. To this end, a split transfer is used to output data alternately from SAM registers a and b such that while one SAM register outputs data, the other SAM register receives new data transferred from the RAM array. In a multiport video RAM without a cross transfer function, it is decided that the left half RAM cell array of FIG. 10 can be connected to the SAM register a and the right hand RAM cell array can be connected to the SAM register b. Therefore, the mapping shown in FIG. 8 essentially leads to the mapping shown in FIG. 10. 1 and 2, 3 and 4, ... shown in FIG. 10 represent cells on the same row. It is therefore possible to write data of the RAM port at high speed, and as viewed from the CRT screen it is possible to write a horizontal line at high speed. However, it is necessary to write data into cells at different rows, in order to display a vertical line on the CRT screen. As a result, on the side of the RAM port, normal write cycles are required to be used for all data write, taking a very long time. The image data write speed from a graphics processor to a multiport video RAM therefore depends upon a vertical line.

SUMMARY OF THE INVENTION

The present invention has been made in view of the above-described circumstances, and it is an object of the present invention to provide a semiconductor memory device wherein data even in the same RAM unit among two RAM units identified by a particular bit (MSB) of an address can be continuously accessed and split-transferred.

It is another object of the present invention to provide an image memory capable of high speed screen processing by making data in RAM at one row correspond to an area on a screen having a shape more like a square, and without changing the buffer memory system depending upon the size of each display screen.

It is a further object of the present invention to provide an image displaying apparatus capable of displaying an image at high speed.

It is a still further object of the present invention to improve a display efficiency by reducing the degree of data write speed unbalance between horizontal and vertical lines, when writing image data from a graphics processor (or controller) into a multiport video RAM.

The multiport semiconductor memory device according to the present invention is constructed of a RAM having a first RAM unit and a second RAM unit, a SAM having a first SAM unit and a second SAM unit, and transfer means capable of selectively taking one of a split transfer state and a cross transfer state, in the split transfer state the first RAM unit and the first SAM unit being connected together and the second RAM unit and the second SAM unit being connected together, and in the cross transfer state the first RAM unit and the second SAM unit being connected together and the second RAM unit and the first SAM unit being connected together.

BRIEF DESCRIPTION OF THE DRAWINGS

FIGS. 5A and 5B are diagrams used for explaining a conventional transfer method, wherein a split transfer method is adopted for data transfer, and a pixel area made in a shape more like a square as much as possible is accessed in a page mode cycle.

FIG. 8 is a diagram showing a CRT mapped on the block unit basis in accordance with the number of dots to be displayed on the CRT.

FIG. 9 shows a memory configuration used for the CRT shown in FIG. 8, wherein a multiport video RAM having a cross transfer function is used as a frame buffer.

FIG. 10 shows a memory configuration used for the CRT shown in FIG. 8, wherein a multiport video RAM having no cross transfer function is used as a frame buffer.

FIG. 12 is a circuit diagram showing a portion of the embodiment.

FIG. 15 is a map of a CRT which is mapped using four divided blocks of one row of a memory as a single unit, while considering the number of dots to be displayed on the CRT.

FIG. 16 shows the correspondence of a multiport video RAM having a cross transfer function and a stop register function used as a frame buffer, relative to the CRT map shown in FIG. 15.

FIG. 17 shows the correspondence of a multiport video RAM having no cross transfer function and using the stop register function, relative to the CRT map shown in FIG. 15.

FIG. 18 is a block diagram showing an embodiment of an image memory according to the present invention.

DESCRIPTION OF THE PREFERRED EMBODIMENTS

Figure 22:
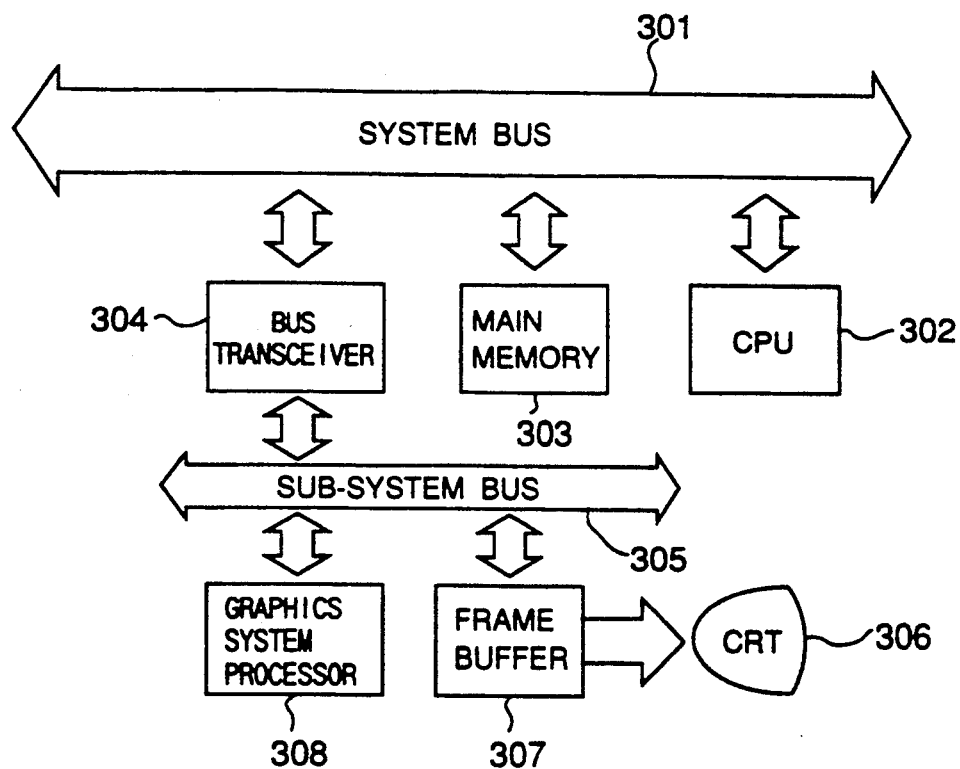
FIG. 22 is a block diagram of a system having a graphics function, the present invention being applied to the system.
Figure 23:
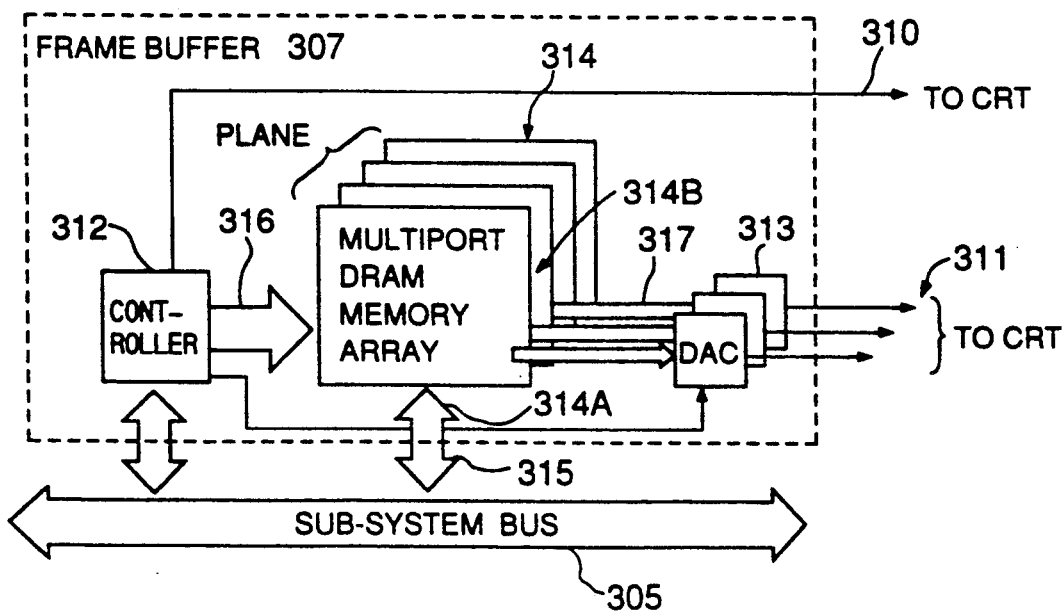
FIG. 23 is a block diagram of the frame buffer shown in FIG. 22 for storing an image data and outputting the image data to be displayed on a CRT.

FIG. 22 shows the overall structure of an image displaying apparatus in which a memory device of the present invention is built, and FIG. 23 shows the details of the frame buffer shown in FIG. 22.

As shown in FIG. 22, connected to a system bus 301 are a main CPU 302, a main memory 303 constructed of a general memory, and a bus transceiver 304. The bus transceiver 304 connects the system bus 301 to a CRT display sub-system bus 305. A CRT 306 is connected via a frame buffer 307 to the sub-system bus 305. A graphics processor 308 for processing image data is also connected to the sub-system bus 305. The frame buffer 307 is constructed of multiport video RAM's of the present invention.

As appreciated from the foregoing description, in the graphics system of the work station, the image processing sub-system for executing distributed processing is provided in order to reduce the load of the main CPU 302.

The details of the frame buffer 307 are shown in FIG. 23. The frame buffer 307 is mainly constructed of a plurality of planes of multiport video RAM's 314, D/A converters (DAC) 313, and a controller 312.

More particularly, the controller 312 supplies a control signal 316 to the multiport video RAM's 314 to control them, and supplies a synchronizing signal 310 to the CRT 306 to control it. Each DAC 313 converts a digital image data from each multiport video RAM 314 into an analog signal which is outputted as an RGB signal. The multiport DRAM's 314 constitute a plurality of planes. RAM ports of the multiport video RAM's 314 are connected via a data bus 315 to the system bus 305.

As seen from the foregoing description, in the frame buffer 307, image data from the sub-system bus 305 is inputted to and stored in each multiport video RAM 314 via the data bus 315 and RAM port 314A. Data outputted from a SAM port 314B of each multiport video RAM 314 is inputted via a data bus 317 to each DAC 313 whereat the data is D/A converted and inputted to CRT 306 as an RGB signal 311 to display an image. The controller 312 supplies the synchronizing signal to CRT 306, and controls the data transfer between RAM and SAM within each multiport video RAM 314.

Figure 11:
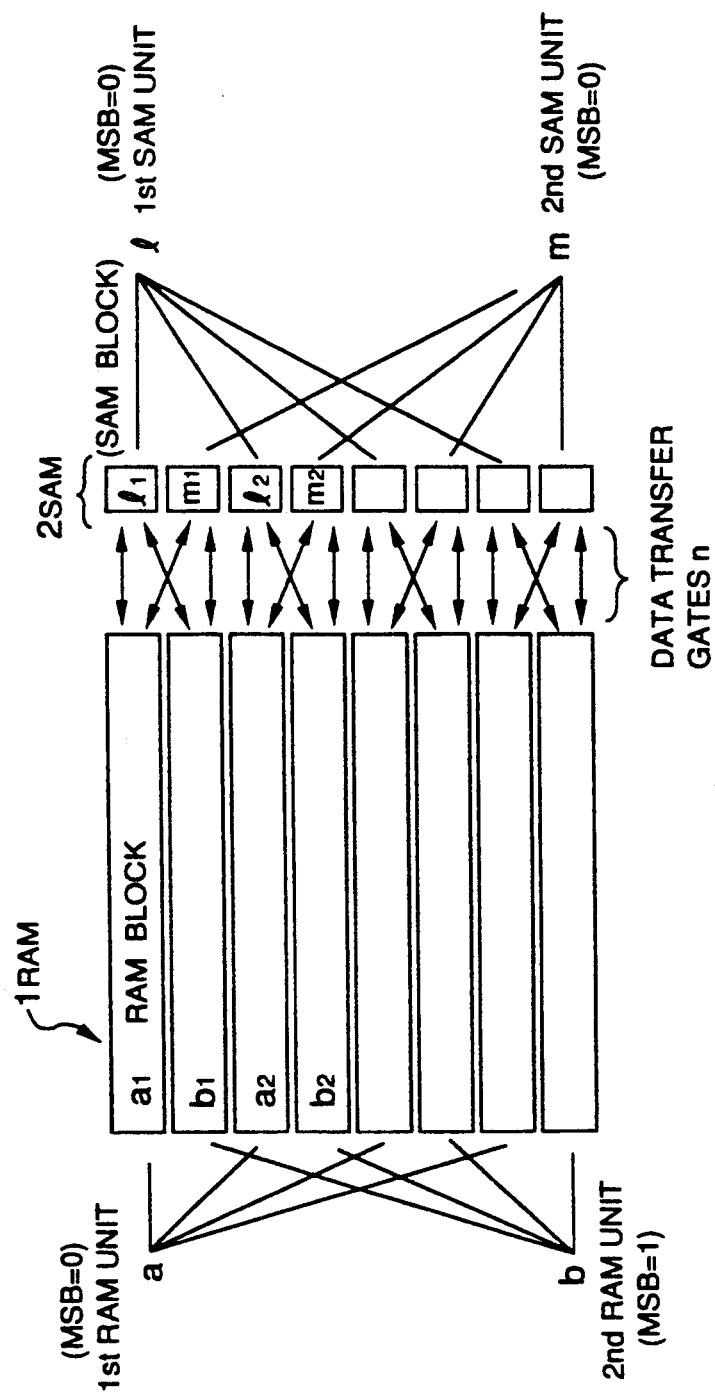
FIG. 11 is a block diagram conceptually showing an embodiment of the present invention.

FIG. 11 is a schematic and conceptual diagram showing an embodiment of the present invention, and FIG. 12 is a circuit diagram showing a portion of FIG. 11.

As seen from FIG. 11, RAM 1 is divided into a first RAM unit a having MSB=0 of a column address and a second RAM unit b having MSB=1. RAM blocks constituting the first and second RAM units $a_1, a_2, \ldots$ and $b_1, b_2, \ldots$ are disposed alternately. SAM 2 is divided into a first SAM unit 1 having MSB=0 of the column address and a second SAM unit m having MSB=1. SAM blocks constituting the first and second SAM units $l_1, l_2, \ldots$ and $m_1, m_2, \ldots$ are disposed alternately.

Transfer gates n connect RAM 1 and SAM 2 in the following manner. Referring to FIG. 11, consider the upper two RAM blocks $a_1$ and $b_1$ of RAM 1 and the upper two SAM blocks $l_1$ and $m_1$ of SAM 2. The transfer gates n transfer data between two blocks having the same level of MSB, i.e., between the RAM block $a_1$ and SAM block $l_1$ and between the RAM block $b_1$ and the SAM block $m_1$. The transfer gates n also transfer data between two blocks having different levels of MSB, i.e., between the RAM block $a_1$ and the SAM block $m_1$ and between the RAM block $b_1$ and the SAM block $l_1$. In other words, the transfer gates n allow data transfer between a certain memory cell of RAM 1 and a SAM data register serially connected to a bit line having a different MSB from that of the column address of the memory cell.

Figure 1A:
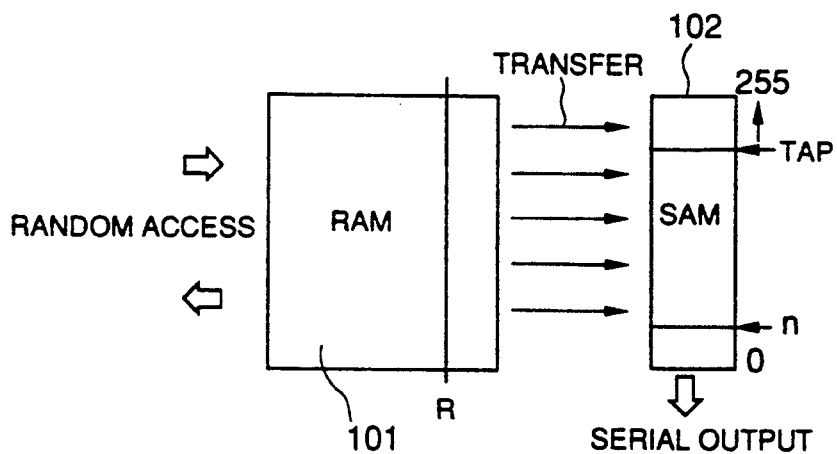
FIGS. 1A and 1B are a schematic diagram of a conventional image memory, and a timing chart therefor.
Figure 1B:
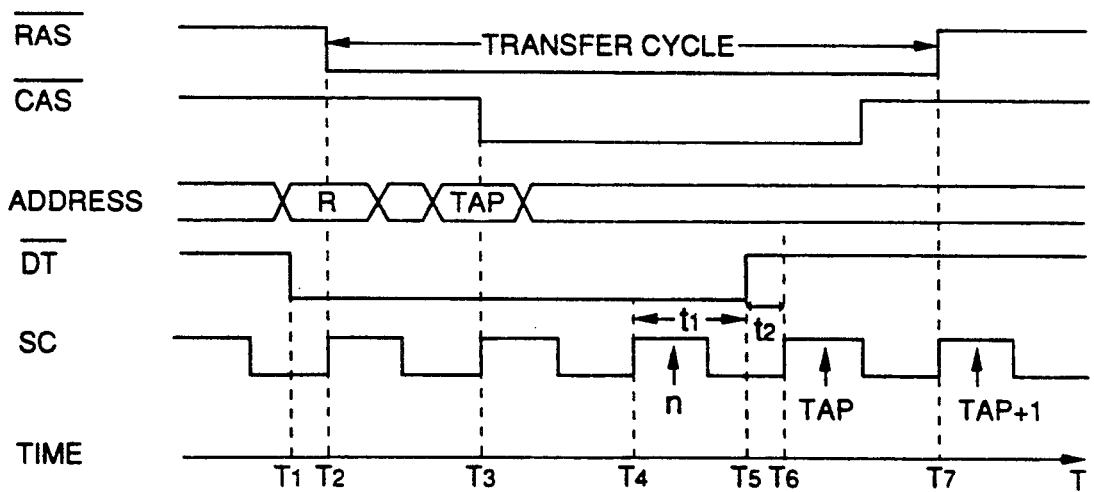
Figure 2A:
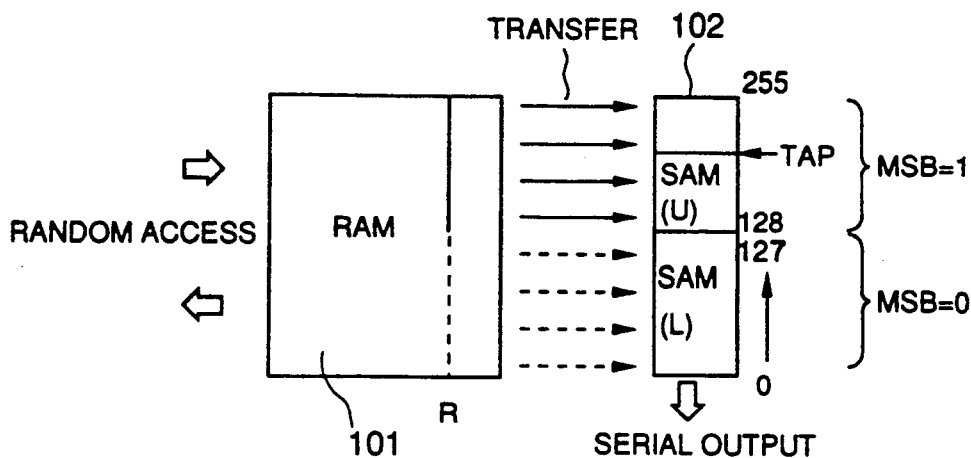
FIGS. 2A and 2B are a schematic diagram used for explaining a conventional split transfer method, and a timing chart therefor.
Figure 2B:
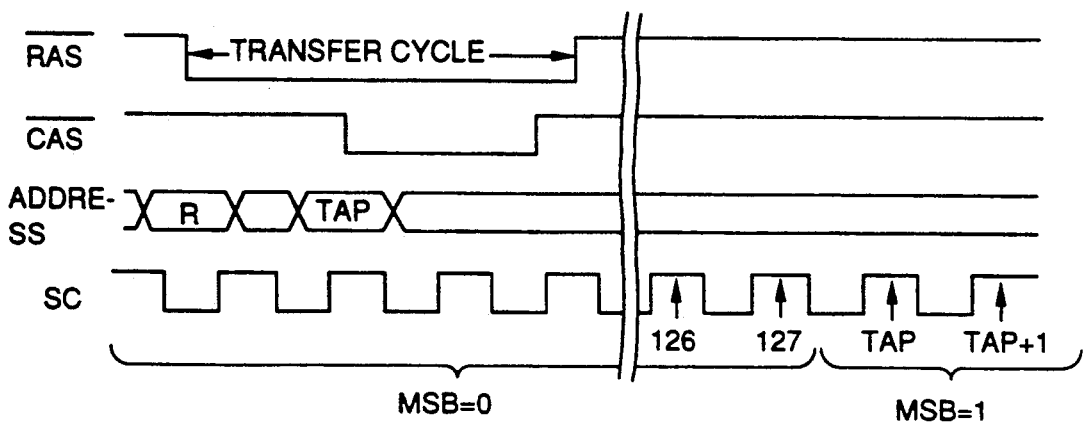
Figure 3:
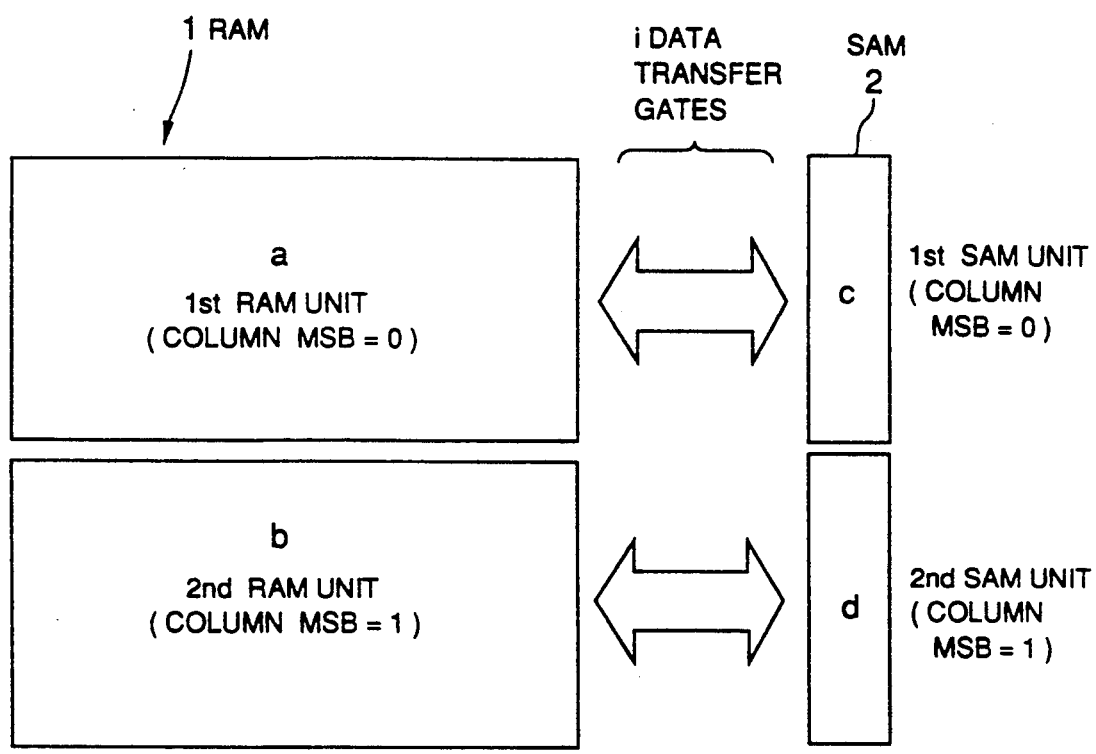
FIG. 3 is a conceptual diagram of a conventional memory.
Figure 4:
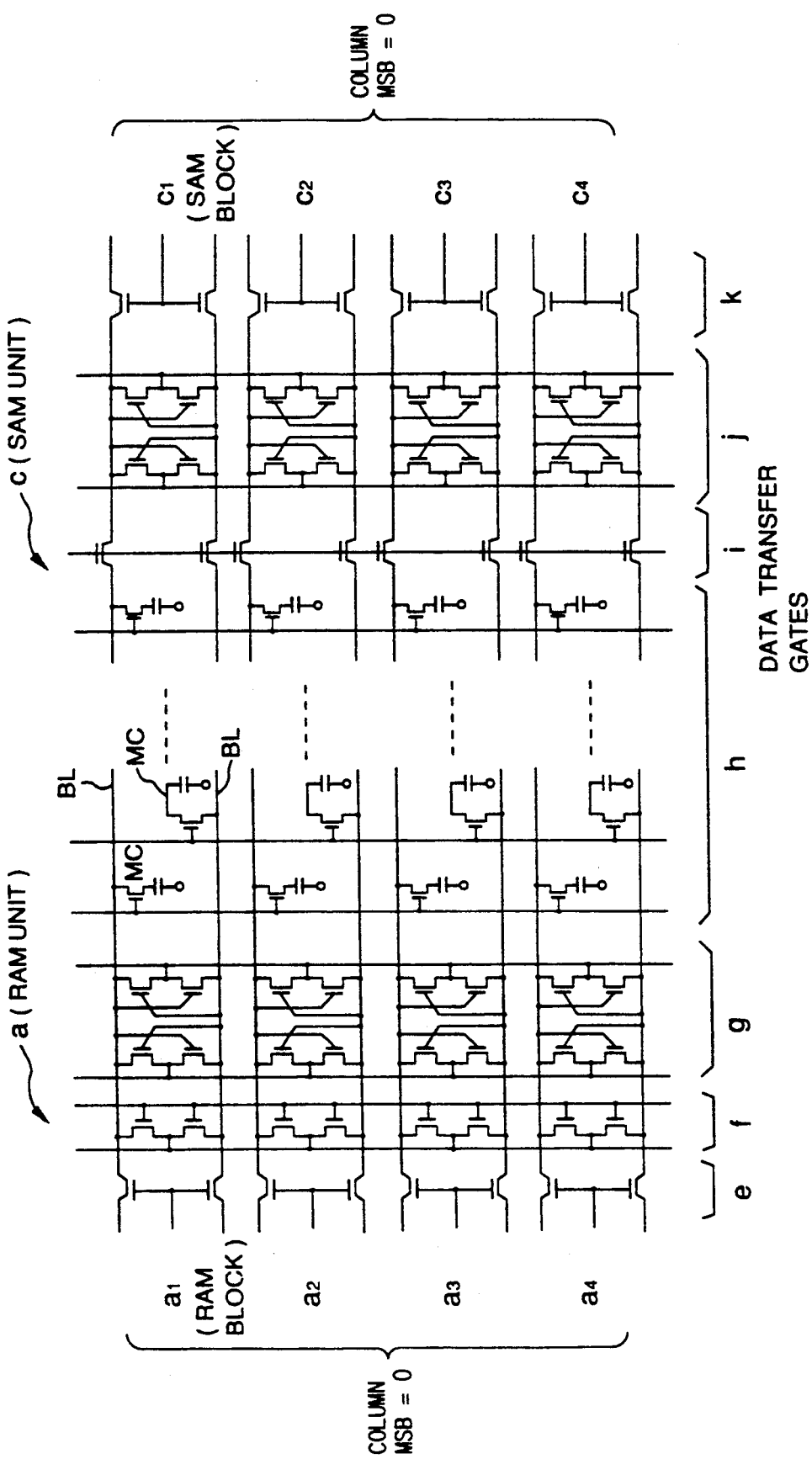
FIG. 4 is a detailed diagram showing a portion of FIG. 3.
Figure 6:
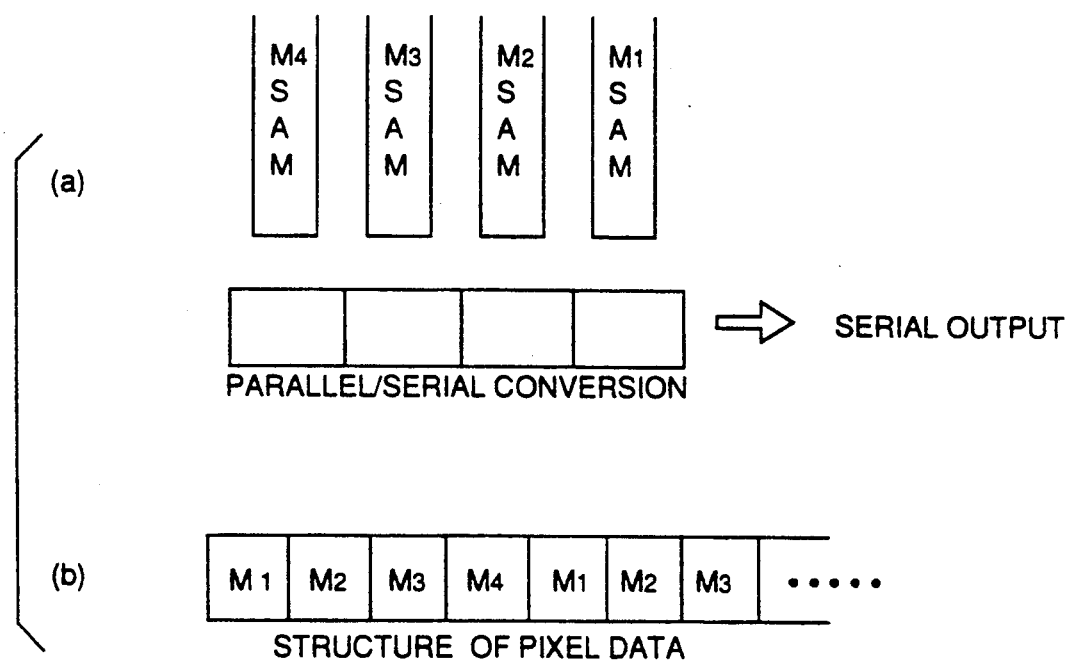
FIG. 6 is diagrams used for explaining the correspondence between SAM ports of four devices and pixels disposed in the scan direction.

FIG. 12 shows the details of the upper four columns of FIG. 11. In FIG. 12, like elements to those shown in FIG. 4 are represented by using identical reference symbols. As seen from FIG. 12, each of the transfer gates n has three types of gates o, p and q. The data transfer first gate o is constructed of transistors $T_1$ provided on bit lines BL and $\overline{BL}$. The gates of transistors $T_1$ at the columns having the same level of MSB of column addresses are connected in common to constitute the same gate lines $o_1$ and $o_2$. The second gate, bit connection gate p, operates to connect the bit lines of adjacent columns. Specifically, transistors $T_2$ are connected between bit lines $BL_1$ and $BL_2$ and between bit lines $\overline{BL_1}$ and $\overline{BL_2}$, and the gates of the transistors are connected in common to a gate line $p_1$. Therefore, for example, the bit lines $BL_1$ and $BL_2$ and the bit lines $\overline{BL_1}$ and $\overline{BL_2}$ are connected together. The third gate, inactive side SAM selection second gate g, is constructed of transistors $T_3$ provided on bit lines, similar to the first gate o. The gates of transistors $T_3$ at the columns having the same level of MSB are connected in common to constitute the same gate lines $q_1$ and $q_2$.

The RAM blocks $a_1, b_1; a_2, b_2; \ldots$ constitute a RAM block pair A, and the SAM blocks $l_1, m_1; l_2, m_2; \ldots$ constitute a SAM block pair B.

In the circuit structure shown in FIG. 12, the RAM block $a_1$ is selectively connected to one of the SAM blocks $l_1$ and $m_1$, and the RAM block $b_1$ is also selectively connected to one of the SAM blocks $l_1$ and $m_1$. For example, as the gate lines $o_1$ and $q_1$ are made active and the gate lines $o_2$, $p_1$ and $q_2$ are made inactive, data in the RAM block $a_1$ is transferred to the SAM block $l_1$. As the gate lines $o_1$, $p_1$ and $q_2$ are made active and the gate lines $o_2$ and $q_1$ are made inactive, data in the RAM block $a_1$ is transferred to the SAM block $m_1$.

More in particular, referring to FIG. 12, during the split (data) transfer, one of the gate lines $o_1$ and $o_2$ of the first gate o becomes of an open state depending upon MSB of a TAP address. The open/close state of the gates p and q is controlled depending upon a use state of the SAM block 2. Namely, by controlling the open/close state of the gates p and g, a cell array h of RAM 1 is connected to a register j of SAM 2 under a standby state.

Figure 13:
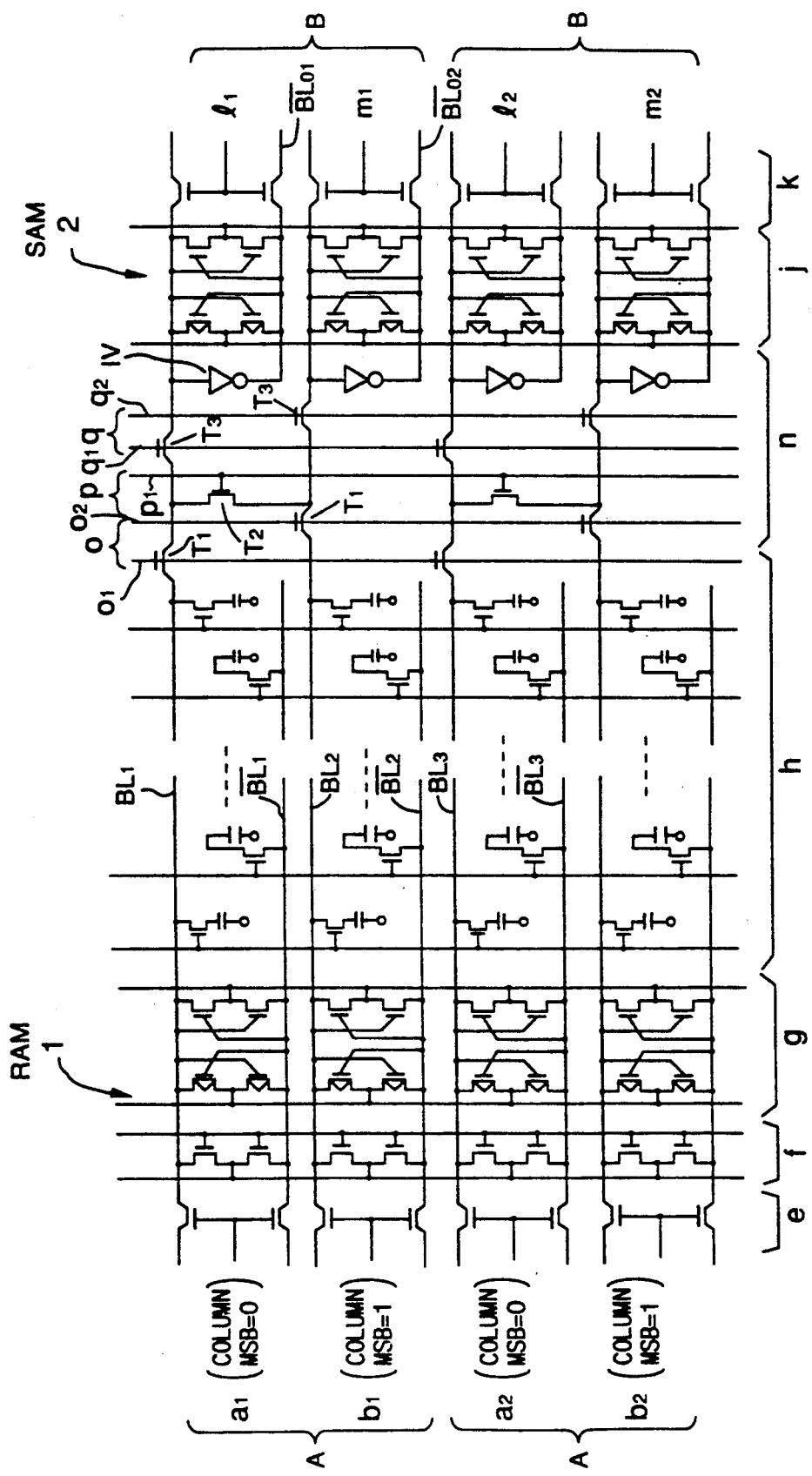
FIG. 13 is a circuit diagram showing a partially modified embodiment of FIG. 12.

FIG. 13 shows a modification of FIG. 12. In FIG. 13, a bit line BL of a pair of complementary bit lines BL and $\overline{BL}$ is used for data transfer. A different point of FIG. 13 from FIG. 12 is that the bit line $\overline{BL}$ is not used for data transfer. Specifically, transistors for the first gate o and second gate g are not provided on the bit lines $\overline{BL}$. Furthermore, transistors for the bit line connection gate p are not provided on the bit lines, e.g and $\overline{BL_1}$ and $\overline{BL_2}$ at adjacent columns. In SAM 2, a bit line BL via which data is transferred from RAM 1 is connected via an inverter IV to a bit line $\overline{BL_0}$ ($\overline{BL_{01}}$, $\overline{BL_{02}}$, ...). The other construction of FIG. 13 is the same as FIG. 12, with like elements being represented by identical reference symbols.

Figure 14:
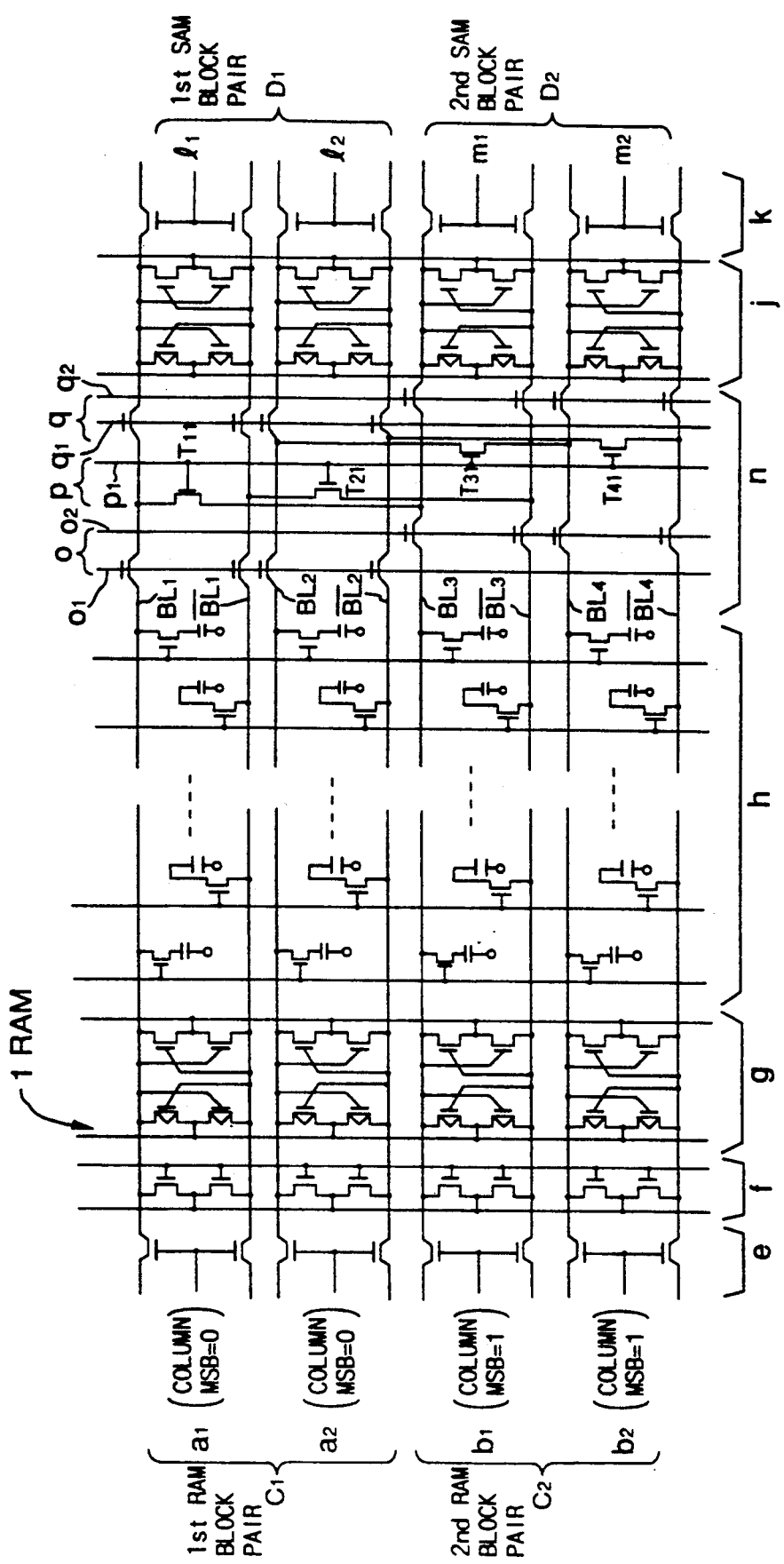
FIG. 14 is a circuit diagram showing a portion of a different embodiment.

FIG. 14 is a circuit diagram showing a portion of another embodiment according to the present invention. As seen from FIG. 14, in RAM 1, two RAM blocks $a_1$ and $a_2$ having column address MSB=0 and two RAM blocks $b_1$ and $b_2$ having column address MSB=1 are disposed alternately. Similarly, in SAM 2, two SAM blocks $l_1$ and $l_2$ having a column address MSB=0 and two SAM blocks $m_1$ and $m_2$ having a column address MSB=1 are disposed alternately.

In the bit line connection gate p of the data transfer gate n, the bit lines $BL_1$ and $\overline{BL}_1$ of a RAM block $a_1$ are connected via transistors $T_{11}$ and $T_{21}$ to the bit lines $BL_3$ and $\overline{BL}_3$ of a RAM block $b_1$, respectively. The bit lines $BL_2$ and $\overline{BL}_2$ of a RAM block $a_2$ are connected via transistors $T_{31}$ and $T_{41}$ to the bit lines $\overline{BL}_4$ of a RAM block $b_2$, respectively. The gate lines of the transistors $T_{11}$ to $T_{41}$ are connected in common to constitute a gate line $p_1$. The whole circuit is constructed of a plurality of units each having four blocks such as blocks $a_1$, $a_2$, $b_1$, and $b_2$ shown in FIG. 14. As seen from FIG. 14, the RAM blocks $a_1$, $a_2$ ; $b_1$, $b_2$ constitute first and second RAM block pairs $C_1$ and $C_2$, respectively, and SAM blocks $l_1$, $l_2$; $m_1$, $m_2$ constitute first and second SAM block pairs $D_1$ and $D_2$, respectively. In FIG. 14, the other elements are the same as FIG. 12, with identical reference symbols being used.

In the device shown in FIG. 14, data in a cell array h of the RAM block $a_1$ is transferred to a data register j of one of the SAM blocks $l_1$ and $m_1$. Data in a cell array h of the RAM block $b_1$ is transferred to a data register j of one of the SAM blocks $m_1$ and $l_1$. Similarly, data in a cell array Of the RAM block $a_2$ is transferred to a data register j of one of the SAM blocks $l_2$ and $m_2$. Data in a cell array h of the RAM block $b_2$ is transferred to a data register j of one of the SAM blocks $m_2$ and $l_2$.

In FIG. 14, the RAM block pair $C_1$, for example, is constructed of the two RAM blocks $a_1$ and $a_2$. The number of blocks is not limited to 2, but it may take a desired number such as "4" or "8".

Also in FIG. 4, the device may be constructed such that data transfer is performed by using only one bit line as in the case of FIG. 13.

In a conventional continuous access during the split transfer, two cell arrays divided by MSB of a column address are accessed alternately. Therefore, MSB's of transferred column addresses (RAM blocks) repetitively take low and high levels. However, according to the embodiments of the present invention, data can be transferred from a RAM block to an inactive SAM data register, without necessarily repeating MSB's of column addresses between low and high levels. Thus, continuous access during the split transfer can be performed even to the same RAM block among first and second RAM blocks divided by MSB of a column address.

According to the present invention, in a semiconductor memory device having a RAM and SAM, data can be transferred not only between a RAM block and the corresponding SAM block, but also between the RAM block and another SAM block not corresponding to the RAM block. Accordingly, during the split data transfer, it is possible to continuously access a RAM block regardless of whether it is a first or second RAM block divided by a particular bit of a column address, thereby allowing continuous access to the same RAM block of RAM.

Next, a frame buffer for executing a cross transfer will be described. A multiport video RAM having a cross transfer function is used as a frame buffer, and a CRT display is mapped as shown in FIG. 8. The multiport video RAM is constructed as shown in FIG. 9. The cross transfer function allows either the right or left side RAM cell array data to be transferred to a SAM register a or b. Therefore, the arrangement shown in FIG. 10 can be changed to the arrangement shown in FIG. 9. As the scan lines of the CRT change in the order of 1, 2, 3, 4, 5, the multiport video RAM operates such that data 1 is transferred to and outputted from the SAM register a, data 2 is transferred to and outputted from the SAM register b, data 3 is transferred to and outputted from the SAM register, and so on. In drawing a vertical line passing through 1 and 3 shown in FIG. 8, a page mode can be used because the data for 1 and 3 is at the same row as shown in FIG. 9. FIG. 9 shows two divided cell arrays for the split function. It is also the same in the case of using a stop register function. A CRT is mapped as shown in FIG. 15, and the corresponding multiport video RAM is constructed as shown in FIG. 16. In FIG. 16, one row is divided into four sections, e.g., 1, 5, 9, and 13. Data within this range can be written by the page mode. The four-divided row sections are connected consecutively in the vertical direction as shown in FIG. 15. It is therefore possible to draw a vertical line on the CRT by using a high speed data write in the page mode. In the case of a multiport video RAM having no cross transfer function, it is constructed as shown in FIG. 17. Therefore, all the divided row sections cannot be disposed on the CRT in the vertical direction. It is also the same for the case of dividing into four or more sections by using the stop register function.

According to the above-described embodiment, a multiport video RAM having a cross transfer function is used as a frame buffer. The CRT display and divided row blocks of the memory are constructed as shown in FIG. 9, in order to map the divided two blocks on the CRT in the vertical direction. As a result, when a graphics processor writes a vertical line data on the CRT into the multiport video RAM, it becomes possible to write a row division number of dots in the page mode.

Next, another embodiment of the present invention will be described from a different viewpoint with reference to other drawings.

FIG. 18 shows an embodiment of an image memory according to the present invention.

The image memory of the present embodiment has a random access memory (RAM) 101, a serial access memory (SAM) 102, a data transfer means 103, and a designating means 104. As shown in FIG. 18, the serial access memory 102 is divided into SAM (U) and SAM (L). The divided SAM (U) and SAM (L) correspond to "1" and "0" of the most significant bit (MSB) of a TAP address, and can transfer data independently from each other. RAM 101 is divided into RAM (1) and RAM (0) corresponding to "1" and "0" of MSB of a TAP address. The row address during the transfer cycle represents a row R, similar to a conventional split transfer. However, in this case, MSB of a TAP address or a column address is not neglected, but the data in RAM (1) or RAM (0) indicated by a TAP address is automatically transferred to SAM (U) or SAM (L) which is not now serially accessed.

Consider now the case wherein while SAM (L) is serially accessed, a transfer cycle occurs to transfer the data in the memory array 101 of the RAM port at the row R. If MSB of the TAP address during the transfer cycle is "1", then the data in RAM (1) corresponding to MSB "1" is transferred to SAM (U). This case is the same as a conventional split transfer. However, if MSB of the TAP address is "0" and data in RAM (0) is transferred to SAM (L), then the SAM data now serially accessed is destroyed. In view of this, according to the image memory of the present embodiment, the cross transfer is automatically selected to transfer data to SAM (U). As the serial access to the transferred data progresses and when it changes from SAM (L) to SAM (U), MSB is accessed from the TAP address in the following manner.

In the device shown in FIG. 18, it is assumed that a transfer cycle occurs relative to the serial address 0 to 127 and the TAP address for this transfer cycle is 50. In this case, RAM data at the column addresses 0 to 127 is cross-transferred to SAM (U) at serial addresses 128 to 255. At the same time, (128+50=) 178 is set as the TAP address. As the serial access progresses to 127 and the next SC cycle enters, the TAP address 178 (corresponding to the data in RAM at an address 50) is accessed to continue the serial access. The designating means 104 designates the serial access addresses (top address TAP and last address LAST) of SAM 102. If a LAST address has been designated, the serial access to SAM (L) is not performed to address 127, but terminated at the LAST address. As the next SC cycle enters, the access to SAM (U) at the TAP address is performed. A single LAST address may be designated at each transfer cycle, or a plurality of LAST addresses may be designated for divided SAM blocks.

Next, there will be described how efficiently an image can be displayed on a screen by executing such a transfer operation.

Figure 7A:
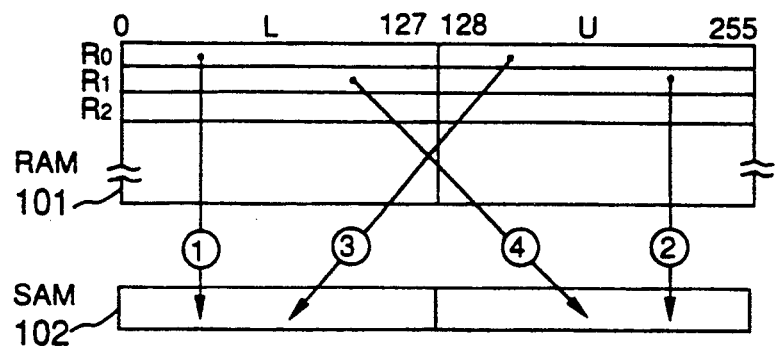
FIGS. 7A and 7B are diagrams used for explaining the problem associated with a conventional image memory, wherein a split transfer method is adopted for data transfer, and a pixel area made in a shape more like a square as much as possible is accessed in a page mode cycle.
Figure 7B:
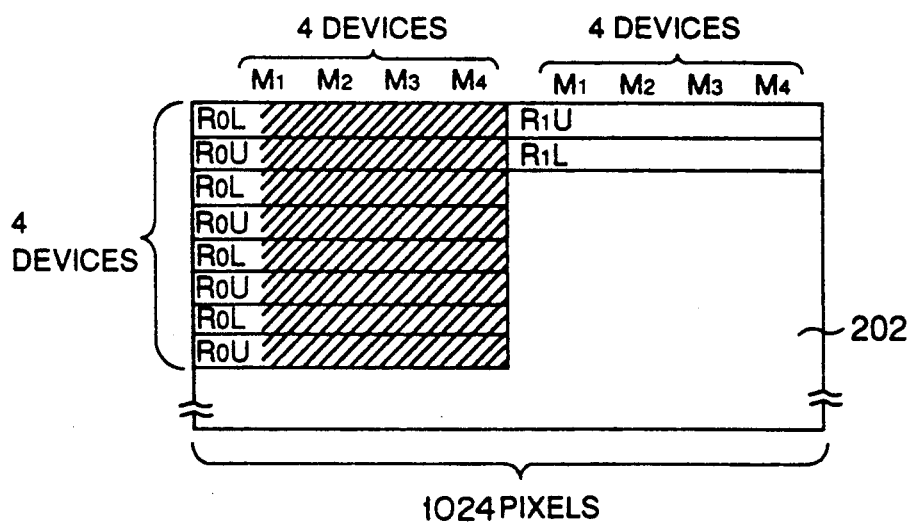

Since the present embodiment adopts the cross transfer, the data transfer as shown in FIG. 7A can be executed. Such an arrangement can deal with the case wherein an even number of tiles are disposed on the screen in the scan direction. As described previously, it is more suitable for high speed screen processing that tiles are disposed in the column direction accessible at a high speed in RAM so as to obtain a pixel area more like a square on the display screen. So long as SAM is used as two divided SAM blocks, it can be understood that the length of a tile in the scan direction becomes longer than in the vertical direction, which is disadvantageous for high speed screen processing.

Figure 19:
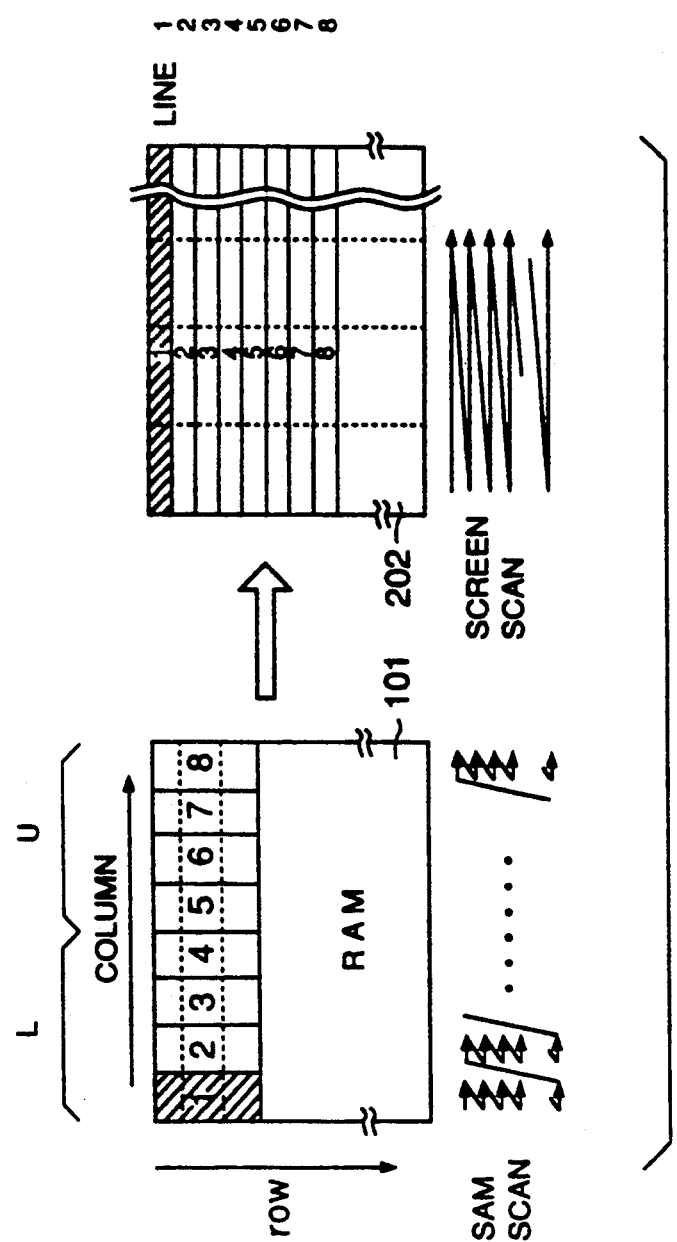
FIG. 19 is a conceptual diagram showing the correspondence between RAM data and pixels on a display screen wherein the data in a rectangular area on the display screen is processed at a high speed.
Figure 20A:
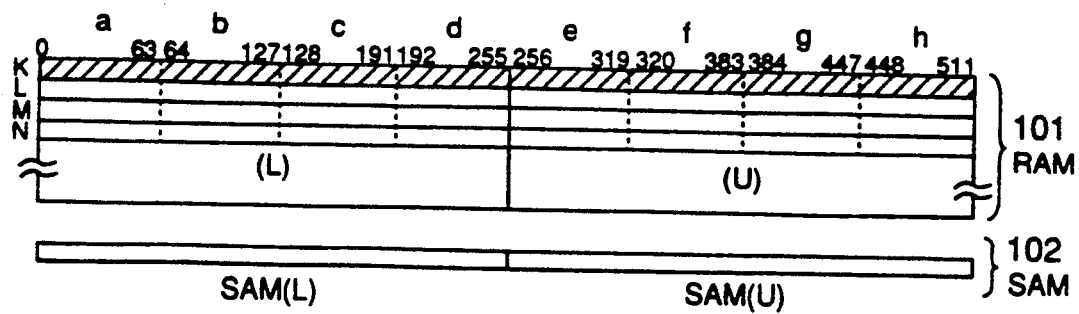
FIGS. 20A and 20B are diagrams used for explaining the correspondence illustrated in FIG. 19.
Figure 20B:
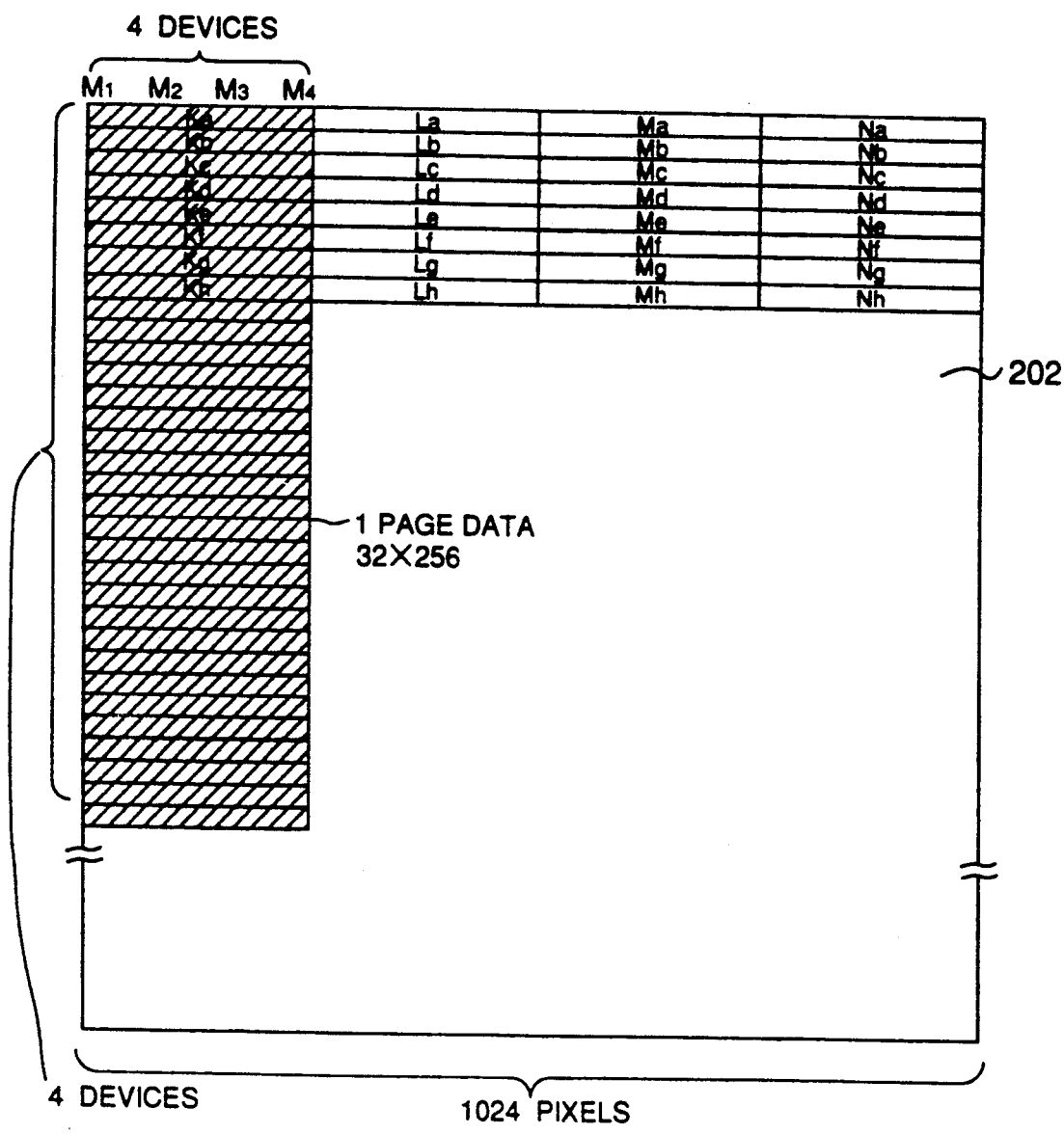

FIG. 19 illustrates an embodiment for making a tile to have a shape like a square as much as possible. Consider the data for eight lines on a display screen 202. The data in RAM 101 at a row in the column direction is made in correspondence with the pixel data within a rectangular area over the eight lines on the display screen 202. The pixel data on the display screen 202 at one line indicated by a hatched portion is made in correspondence with the hatched rectangular area of RAM 101. The remaining RAM areas are made in correspondence with the rectangular areas on the display screen 202, in the same manner as above. Scanning the display screen 202 is carried out in the order of line 1, line 2, line 3, . . . The data transfer from RAM 101 to SAM 102 is carried out one row after another. The data transfer is carried out in such a manner that SAM 102 is serially accessed first for the area 1, second for the area 2, third for the area 3, . . . In this case, since the split transfer and cross transfer are available, there is no timing restriction as a conventional real time transfer. A particular example of the correspondence between the data in RAM 101 and screen 202 is shown in FIGS. 20A and 20B. In FIGS. 20A and 20B, the display screen 202 is assumed as constructed of 1024 pixels per line. RAM 101 is constructed of 512 columns which are divided into eight areas from a to h as shown in FIG. 20A. As a method of dividing RAM 101, the seven LAST addresses for dividing SAM into eight blocks are designated in the manner described before, including addresses 63, 127, 191, . . . , 447. Rows are represented by K, L, M, N, . . . and the data at the row K in the area a for example is represented by Ka. The data Ka to Kh constitute the hatched rectangular area on the display screen 202 as shown in FIG. 20B. In order to sequentially display lines on the display screen, it is necessary to serially output the data in RAM in the order of Ka, La, Ma, Na, Kb, Lb, . . . For this reason, the data at row K on the (L) side is split-transferred to SAM (L), and serially outputted therefrom after setting the TAP address to 0. Next, the data at row L on the (L) side is cross-transferred to SAM (U) and serially outputted therefrom after setting the TAP address to 0. In this manner, data is sequentially outputted by alternately repeating the split transfer and cross transfer. For the second and following lines, the TAP addresses are set 64, 128, . . . A tile is constituted by 256 pixels in the line direction, and 32 pixels in the vertical direction. If the length of data outputted from SAM is further shortened, tiles more like a square can be filled in. By accessing RAM 101 in the column direction at a high speed, e.g., by accessing in the page mode, the display screen 202 can be processed at a high speed.

Figure 21A:
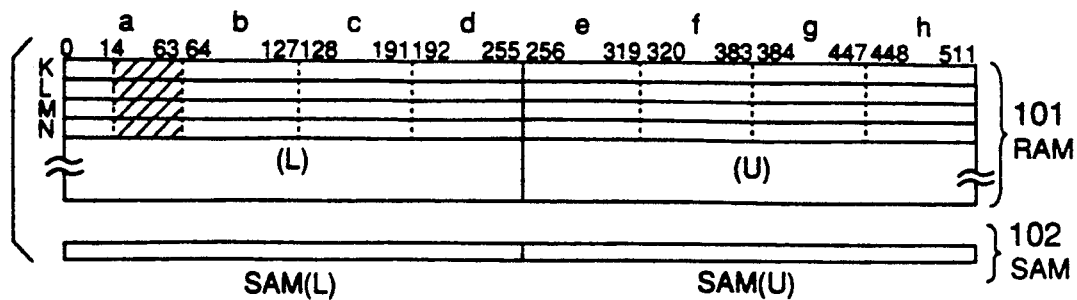
FIGS. 21A and 21B are diagrams used for explaining a method of dealing with a small display screen size by using the buffer memory shown in FIGS. 20A and 20B.
Figure 21B:
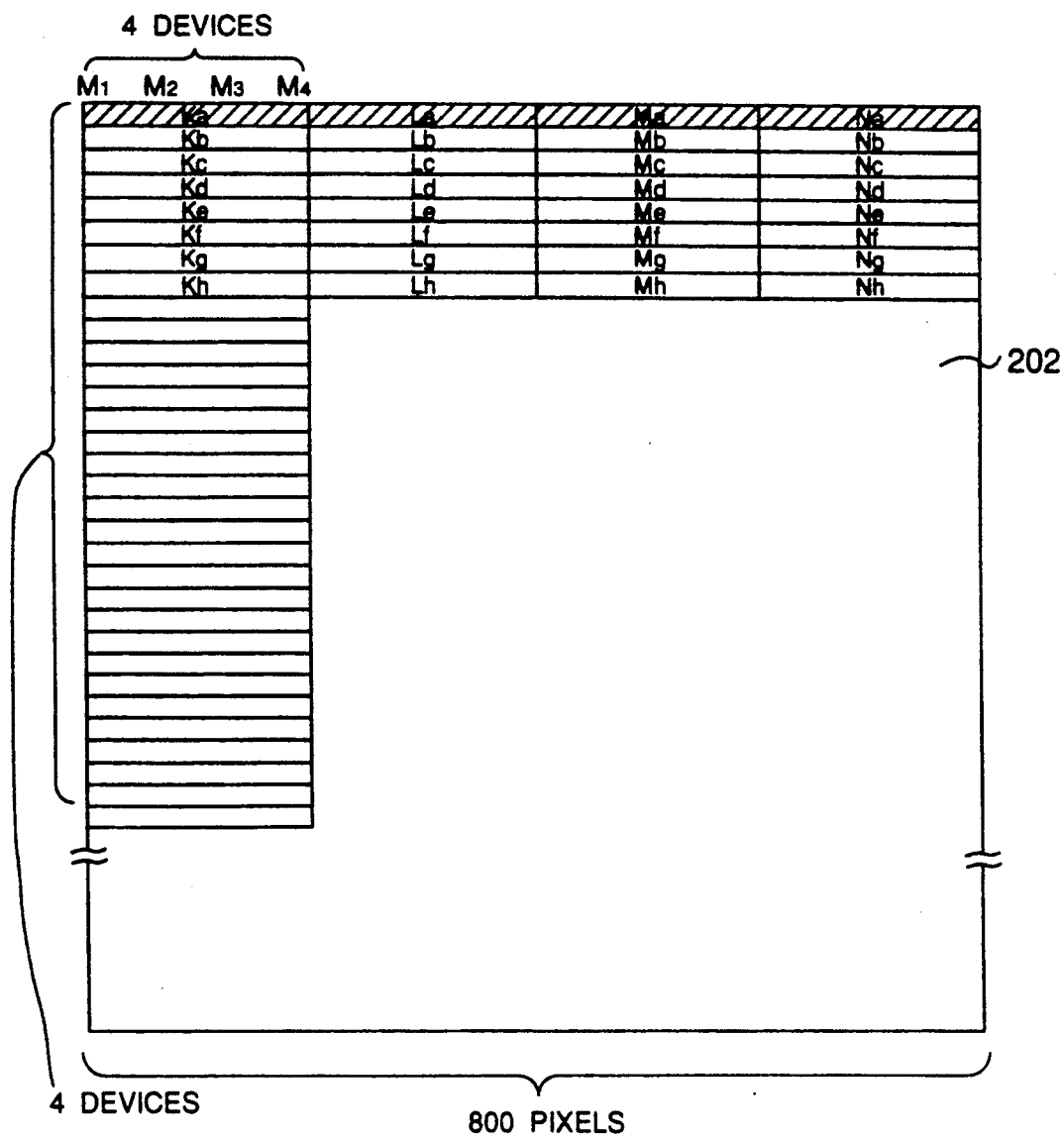

FIGS. 21A and 21B illustrate the case wherein a smaller screen size is processed without changing the buffer memory used in the embodiment shown in FIGS. 20A and 20B. As described above, the tile of the buffer memory is constructed of 4×4 devices, and RAM 101 is constructed of 512 columns. It is assumed that the screen size is defined by 800 pixels in the scan direction. Designating the LAST addresses for dividing RAM 101 can be changed easily by using a last address change cycle or the like. In this case, RAM 101 is divided into eight blocks as above. Rows are represented by K, L, M, N, . . . and the data at row K in the area a for example is represented by Ka. The data Ka to Kh constitutes a rectangular area (tile) indicated by hatched lines on the display screen 202 as shown in FIG. 21A. In order not to change the structure of the buffer memory, the following method is used. Namely, four tiles are disposed on the display screen 202 in the scan direction, and each tile is constituted by four devices. Accordingly, sixteen divided-by-8 SAM blocks correspond to 800 pixels of the display screen 202. Therefore, the length of each divided-by-8 SAM block is changed from 64 bits to 50 bits. This change can be executed in accordance with the TAP address during each transfer cycle. For example, in serially outputting the data Ka, the TAP address is set to 14, and 50 bit data up to address 63 is outputted.

According to the present embodiment, data can be transferred from a random access memory to a serial access memory without any restriction, the length of data outputted from the serial access memory to the display screen can be set as desired, and display screens of various sizes can be dealt without changing the buffer memory system.

We claim:

1. A multiport semiconductor memory device comprising:
   a RAM having a first RAM unit and a second RAM unit;
   a SAM having a first SAM unit and a second SAM unit; and
   transfer means capable of selectively taking one of a split transfer state and a cross transfer state, in said split transfer state said first RAM unit and said first SAM unit being connected together and said second RAM unit and said second SAM unit being connected together, and in said cross transfer state said first RAM unit and said second SAM unit being connected together and said second RAM unit and said first SAM unit being connected together.

2. A multiport semiconductor memory device according to claim 1, wherein said first SAM unit and said second SAM unit alternately and serially output data.

3. A multiport semiconductor memory device according to claim 1, wherein said transfer means selectively takes one of said, split transfer state and said cross transfer state to a desired connect a desired one of said first and second RAM units to one of said first and second SAM units which has already outputted data.

4. A multiport semiconductor memory device according to claim 2, wherein said transfer means selectively takes one of said split transfer state and said cross transfer state to a desired connect a desired one of said first and second RAM units to one of said first and second SAM units which has already outputted data.

5. A multiport semiconductor memory device according to claim 3, wherein one of said first and second RAM units is selected by a selection signal.

6. A multiport semiconductor memory device according to claim 4, wherein one of said first and second RAM units is selected by a selection signal.

7. A multiport semiconductor memory device according to claim 5, wherein said selection signal is one bit of a column address.

8. A multiport semiconductor memory device according to claim 6, wherein said selection signal is one bit of a column address.

9. A multiport semiconductor memory device according to claim 6, wherein said first and second RAM units have a plurality of RAM blocks, one of every RAM blocks constitute said first RAM unit, and the others of every second RAM blocks constitute said second RAM unit.

10. A multiport semiconductor memory device according to claim 7, wherein said first and second RAM units have a plurality of RAM blocks, one of every second RAM blocks constitute said first RAM unit, and the others of every second RAM blocks constitute said second RAM unit.

11. A multiport semiconductor memory device according to claim 8, wherein said first and second RAM units have a plurality of RAM blocks, one of every second RAM blocks constitute said first RAM unit, and the others of every second RAM blocks constitute said second RAM unit.

12. A multiport semiconductor memory device according to claim 9, wherein said RAM blocks belonging to said first RAM unit and said RAM blocks belonging to said second RAM unit are alternately disposed in the column direction.

13. A multiport semiconductor memory device according to claim 10, wherein said RAM blocks belonging to said first RAM unit and said RAM blocks belonging to said second RAM unit are alternately disposed in the column direction.

14. A multiport semiconductor memory device according to claim 11, wherein said RAM blocks belonging to said first RAM unit and said RAM blocks belonging to said second RAM unit are alternately disposed in the column direction.

15. A multiport semiconductor memory device according to claim 12, wherein said first and second SAM units has a plurality of SAM blocks disposed in the column direction, each of said SAM blocks being in one-to-one correspondence with each of said RAM blocks, ones of every second SAM blocks constituting said first SAM unit, and the others of every second SAM blocks constitute said second SAM unit.

16. A multiport semiconductor memory device according to claim 13, wherein said first and second SAM units has a plurality of SAM blocks disposed in the column direction, each of said SAM blocks being in one-to-one correspondence with each of said RAM blocks, ones of every second SAM blocks constituting said first SAM unit, and the others of every second SAM blocks constitute said second SAM unit.

17. A multiport semiconductor memory device according to claim 14, wherein said first and second SAM units has a plurality of SAM blocks disposed in the column direction, each of said SAM blocks being in one-to-one correspondence with each of said RAM blocks, ones of every second SAM blocks constituting said first SAM unit, and the others of every second SAM blocks constitute said second SAM unit.

18. A multiport semiconductor memory device according to claim 9, wherein a first plurality of said RAM blocks belonging to said first RAM unit and a second plurality of said RAM blocks belonging to said second RAM unit are disposed alternately in the column direction.

19. A multiport semiconductor memory device according to claim 10, wherein a first plurality of said RAM blocks belonging to said first RAM unit and a second plurality of said RAM blocks belonging to said second RAM unit are disposed alternately in the column direction.

20. A multiport semiconductor memory device according to claim 11, wherein a first plurality of said RAM blocks belonging to said first RAM unit and a second plurality of said RAM blocks belonging to said second RAM unit are disposed alternately in the column direction.

21. A multiport semiconductor memory device according to claim 18, wherein said SAM has a plurality of SAM blocks disposed in the column direction, each of said SAM blocks being in one-to-one correspondence with each of said RAM blocks, a plurality of adjacent said SAM blocks alternately constitute said first and second SAM units.

22. A multiport semiconductor memory device according to claim 19, wherein said SAM has a plurality of SAM blocks disposed in the column direction, each of said SAM blocks being in one-to-one correspondence with each of said RAM blocks, a plurality of adjacent said SAM blocks alternately constitute said first and second SAM units.

23. A multiport semiconductor memory device according to claim 20, wherein said SAM has a plurality of SAM blocks disposed in the column direction, each of said SAM blocks being in one-to-one correspondence with each of said RAM blocks, a plurality of adjacent said SAM blocks alternately constitute said first and second SAM units.

24. A multiport semiconductor memory device comprising:
   a RAM having a first RAM unit and a second RAM unit which are selected in accordance with a certain bit of a column address, each of said first and second RAM units having a plurality of RAM blocks;
   a SAM having a first SAM unit corresponding to said first RAM unit and a second SAM unit corresponding to said second RAM unit, each of said first and second SAM units having a plurality of SAM blocks, each of said SAM blocks of said first SAM unit being in one-to-one correspondence in a column direction with each of said RAM blocks of said first RAM unit, and each of said SAM blocks of said second SAM unit being in one-to-one correspondence in a column direction with each of said RAM blocks of said second RAM unit; and
   data transfer means capable of selectively taking one of two functions, one function being for connecting one of said RAM blocks to the corresponding one of said SAM blocks, and the other function being for connecting one of said RAM blocks to one of said SAM blocks belonging to said SAM unit not corresponding to said RAM unit belonging to the one of said RAM blocks, the SAM unit which includes said one of said SAM blocks not corresponding to the RAM unit which includes said one of said RAM blocks.

25. A multiport semiconductor memory device according to claim 24, wherein:
   said RAM has a plurality of RAM block pairs, each pair having a first RAM block belonging to said first RAM unit, and a second RAM block belonging to said second RAM unit and adjacent to said first RAM block;
   said SAM has a plurality of SAM block pairs, each pair having a first SAM block corresponding to said first RAM block and a second SAM block corresponding to said second RAM block; and
   said transfer means executes data transfer by selectively connecting said first RAM block to one of said first and second SAM blocks, and selectively connecting said second RAM block to one of said first and second RAM blocks.

26. A multiport semiconductor memory device according to claim 24, wherein:
   said RAM has a first RAM block pair of third and fourth RAM blocks belonging to said first RAM unit and adjacent each other and a second RAM block pair, adjacent to said first RAM block pair, of fifth and sixth RAM blocks belonging to said second RAM unit and adjacent each other, said first and second RAM block pairs being disposed alternately;
   said SAM has a first SAM block pair of third and fourth SAM blocks corresponding in a column direction to said third and fourth RAM blocks and a second SAM block pair, adjacent said first SAM block pair, of fifth and sixth SAM blocks belonging in the column direction to said fifth and sixth RAM blocks, said first and second SAM block pairs being disposed alternately; and
   said transfer means executes data transfer by selectively connecting one of said third and fifth RAM blocks to one of said third and fifth SAM blocks, and by selectively connecting one of said fourth and sixth RAM blocks to one of said fourth and sixth SAM blocks.

27. A multiport semiconductor memory device according to claim 24, wherein data transfer between a RAM block and a SAM block is executed via one of the column line pair.

28. A multiport semiconductor memory device according to claim 25, wherein data transfer between a RAM block and a SAM block is executed via one of the column line pair.

29. A multiport semiconductor memory device according to claim 26, wherein data transfer between a RAM block and a SAM block is executed via one of the column line pair.

30. A multiport semiconductor memory device according to claim 1, further comprising display means for displaying an image on a display screen in accordance with an output from said SAM.

31. A multiport semiconductor memory device according to claim 23, further comprising display means for displaying an image on a display screen in accordance with an output from said SAM.

32. A multiport semiconductor memory device according to claim 24, further comprising display means for displaying an image on a display screen in accordance with an output from said SAM.

33. A multiport semiconductor memory device according to claim 26, further comprising display means for displaying an image on a display screen in accordance with an output from said SAM.

34. A multiport semiconductor memory device according to claim 1, further comprising designating means for designating data output start and end addresses in said first and second SAM units, and causing the data at addresses within the designated range to be outputted from said first and second SAM units.

35. A multiport semiconductor memory device according to claim 23, further comprising designating means for designating data output start and end addresses in said first and second SAM units, and causing the data at addresses within the designated range to be outputted from said first and second SAM units.

36. A multiport semiconductor memory device according to claim 24, further comprising designating means for designating data output start and end addresses in said first and second SAM units, and causing the data at addresses within the designated range to be outputted from said first and second SAM units.

37. A multiport semiconductor memory device according to claim 26, further comprising designating means for designating data output start and end addresses in said first and second SAM units, and causing the data at addresses within the designated range to be outputted from said first and second SAM units.

* * * * *